(12) United States Patent
Gudem et al.

(10) Patent No.: US 8,774,874 B2
(45) Date of Patent: Jul. 8, 2014

(54) REDUCING POWER CONSUMPTION BY IN-CIRCUIT MEASUREMENT OF RECEIVE BAND ATTENUATION AND/OR NOISE

(75) Inventors: Prasad S. Gudem, San Diego, CA (US); Bhushan Asuri, San Diego, CA (US); Soon-Seng Lau, San Diego, CA (US); Wingching Vincent Leung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 398 days.

(21) Appl. No.: 12/794,239

(22) Filed: Jun. 4, 2010

(65) Prior Publication Data
US 2011/0300914 A1 Dec. 8, 2011

(51) Int. Cl.
*H04B 1/38* (2006.01)

(52) U.S. Cl.
USPC ........... 455/570; 455/78; 455/522; 455/114.2

(58) Field of Classification Search
USPC .................. 455/522, 574, 69, 435.1; 375/345
See application file for complete search history.

(56) References Cited

U.S. PATENT DOCUMENTS

| 6,282,177 | B1 * | 8/2001 | Ostermiller et al. .......... 370/278 |
|---|---|---|---|
| 6,298,221 | B1 | 10/2001 | Nguyen |
| 7,283,851 | B2 | 10/2007 | Persico et al. |
| 2003/0050018 | A1 * | 3/2003 | Weissman et al. .............. 455/82 |
| 2005/0134336 | A1 | 6/2005 | Goldblatt et al. |
| 2008/0175332 | A1 * | 7/2008 | Coon ............................. 375/267 |
| 2010/0034327 | A1 * | 2/2010 | Rimini ........................ 375/345 |
| 2010/0197306 | A1 * | 8/2010 | Lopes ........................ 455/435.1 |
| 2011/0256899 | A1 * | 10/2011 | Khazei .......................... 455/517 |

FOREIGN PATENT DOCUMENTS

| EP | 1198067 A2 | 4/2002 |
|---|---|---|
| EP | 1564897 A1 | 8/2005 |
| WO | WO2005099109 A1 | 10/2005 |
| WO | WO2009106929 A1 | 9/2009 |

OTHER PUBLICATIONS

International Search Report and Written Opinion—PCT/US2011/038245, ISA/EPO-Sep. 6, 2011.

* cited by examiner

*Primary Examiner* — Kathy Wang-Hurst
(74) *Attorney, Agent, or Firm* — Ramin Mobarhan

(57) ABSTRACT

Although the duplexer in a full-duplex transceiver circuit may only be guaranteed by the duplexer manufacturer to have a transmit band rejection from its TX port to its RX port of a certain amount, and may only be guaranteed to have a receive band rejection of another amount, the actual transmit band rejection and the actual receive band rejection of a particular instance of the duplexer may be better than specified. Rather than consuming excess power in the receiver and/or transmitter in order to meet performance requirements assuming the duplexer only performs as well as specified, the duplexer's in-circuit performance is measured as part of a transmitter-to-receiver isolation determination. Transmitter and/or receiver power settings are reduced where possible to take advantage of the measured better-than-specified in-circuit duplexer performance, while still meeting transceiver performance requirements. Power settings are not changed during normal transmit and receive mode operation.

31 Claims, 16 Drawing Sheets

|  | HIGHER RX POWER SETTING | LOWER RX POWER SETTING | |
|---|---|---|---|
| RX PLL AND BUFFER (49,60) | 10mA | 10mA | ⎫ |
| RX VCO(50) | 10mA | 7mA | ⎬ RX LO PATH |
| RX LO BUFFER (52) | 5mA | 2.5mA | ⎬ (LARGER NUMBERS) |
| RX LO Gm (53) | 10mA | 5mA | ⎬ |
| DIV (56,57) | 10mA | 5mA | ⎭ |
| RX LNA (14) | 5mA | 3mA | ⎫ |
| RX QUAD MIXER AND BUFF (16, 58) (or zero mA if it is a passive mixer) | 10mA | 5mA | ⎬ RX SIGNAL PATH (SMALLER NUMBERS) |
| RX BASEBAND FILTER (17) | 6mA | 4mA | ⎭ |

RECEIVER POWER SETTINGS

FIG. 4

|  | HIGHER TX POWER SETTING | LOWER TX POWER SETTING | |
|---|---|---|---|
| TX PLL (39) | 10mA | 10mA | ⎫ |
| TX VCO (40) | 10mA | 7mA | ⎬ |
| TX VCO BUFFER (42) | 5mA | 2.5mA | ⎬ TX LO PATH (LARGER NUMBERS) |
| TX LO Gm (43) | 10mA | 5mA | ⎬ |
| DIV (46) | 10mA | 5mA | ⎭ |
| TX BASEBAND FILTER (19) | 2mA | 1mA | ⎫ |
| TX QUAD MIXER AND BUFF (22,47) | 10mA | 5mA | ⎬ TX SIGNAL PATH (SMALLER NUMBERS) |
| TX DRIVER AMP (24) | 10mA | 5mA | ⎭ |

TRANSMITTER POWER SETTINGS

FIG. 5

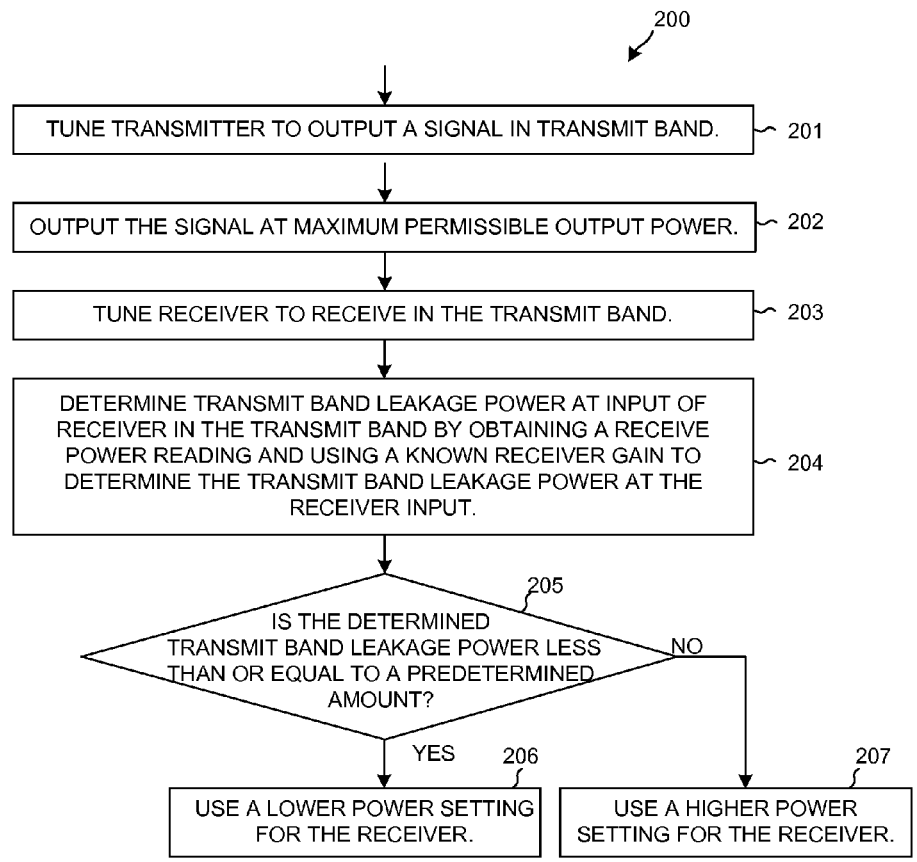

FIG. 11

| TX OUTPUT POWER AT MAX POWER SETTING | DUPLEXER ATTENUATION IN TRANSMIT BAND | TX BAND LEAKAGE POWER WHEN TX IS AT MAX OUTPUT POWER | RECEIVE POWER READING (RSSI) | RECEIVER GAIN | RX POWER SETTING |
|---|---|---|---|---|---|
| +25 dBm | 55 dB | -30 dBm | +20 dBm | 50 dB | HIGHER |
| +25 dBm | 60 dB | -35 dBm | +15 dBm | 50 dB | LOWER |
|  |  | LESS THAN OR EQUAL TO -35 dBm |  |  | LOWER |
|  |  | MORE THAN -35 dBm |  |  | HIGHER |

THE RECEIVER IS DESIGNED TO HAVE ACCEPTABLE PERFORMANCE WITH UP TO -35 dBm OF TX LEAKAGE IN THE LOW POWER RECEIVE POWER SETTING

FIG. 12

| TX OUTPUT POWER P1 AS MEASURED BY POWER DETECTOR | RECEIVE POWER READING (RSSI) | RECEIVER GAIN | DETERMINED RECEIVE BAND POWER P2 AT RX INPUT | DETERMINED SIGNAL PATH RECEIVE BAND ATTENUATION (P1-P2) | TX POWER CONSUMPTION SETTING |
|---|---|---|---|---|---|
| +25 dBm | +20 dBm | 50 dB | -30 dBm | 55 dB | HIGHER |
| +25 dBm | +15 dBm | 50 dB | -35 dBm | 60 dB | LOWER |
| | | | | MORE THAN OR EQUAL TO 60 dB | LOWER |
| | | | | LESS THAN 60 dB | HIGHER |

FIG. 15

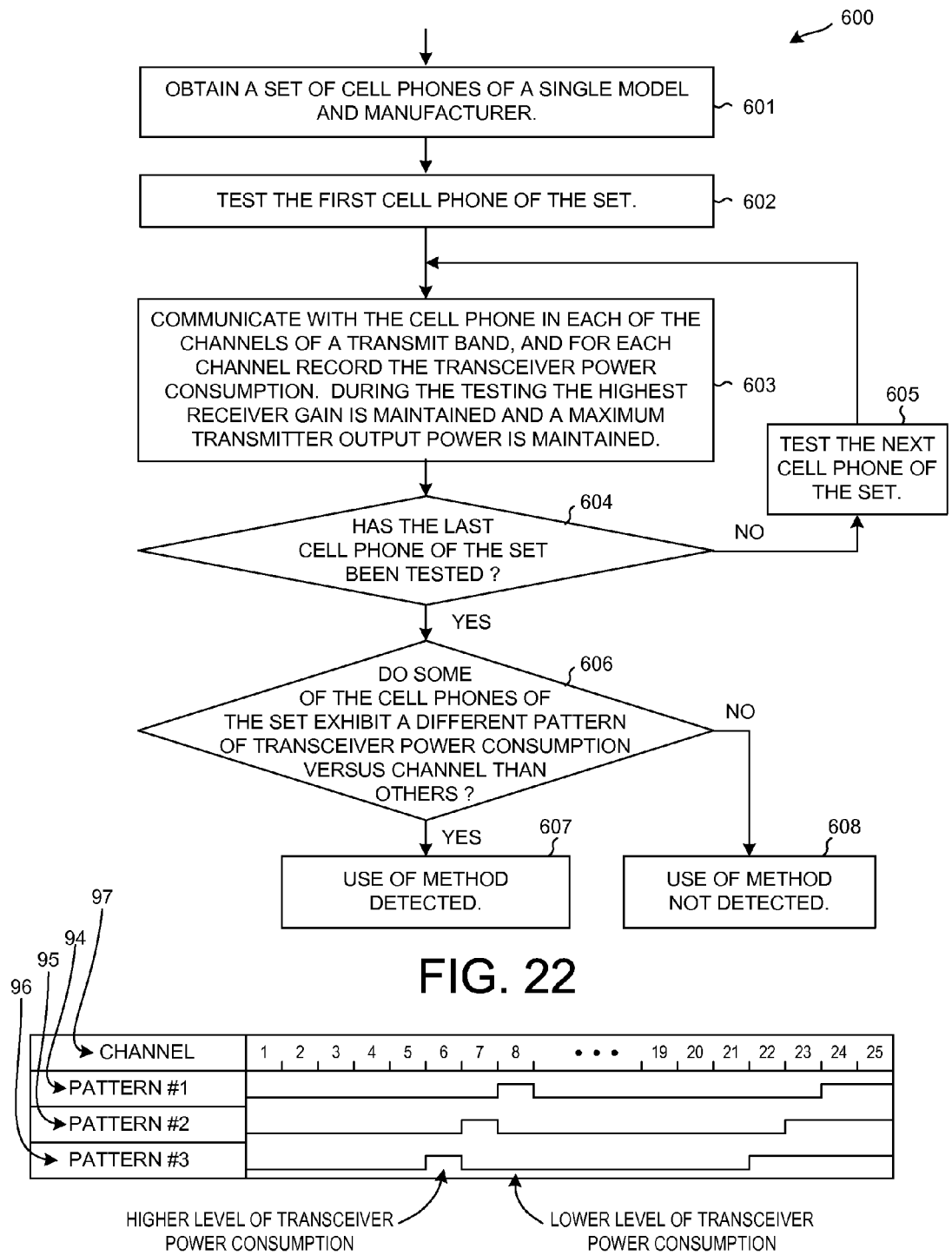

REDUCING POWER CONSUMPTION BY IN-CIRCUIT MEASUREMENT OF RECEIVE BAND ATTENUATION AND/OR NOISE

BACKGROUND INFORMATION

1. Technical Field

The present disclosure relates to reducing power consumption in wireless communication devices, and more particularly to reducing power consumption in full-duplex cellular telephones as a result of an in-circuit determination of a transmitter-to-receiver isolation parameter.

2. Background Information

In a typical cellular telephone handset, a large portion of the cellular telephone's battery energy (about sixty percent) is consumed by the RF transceiver. Within the RF transceiver, power consumption is almost equally split between the transmit signal path and its transmit local oscillator and the receive signal path and its receive local oscillator. A typical cellular telephone consumes 100 mA, and a typical cellular battery has 800 mA-hours of capacity, so the typical cellular telephone has a talk time of approximately eight hours. Extending this talk time is desired.

Several methods and techniques have been developed to reduce power consumption in these portions of the RF transceiver that consume the bulk of the battery energy. Some of these methods and techniques involve power biasing different parts of the transceiver in different ways and at different levels depending on the operating environment of the cellular telephone. For example, if no jammer is detected or if the cellular telephone transmitter is not active, then transceiver circuitry may be powered at a lower level whereas if a jammer is detected or if the transmitter is active then the circuitry is powered at a higher level. U.S. Patent Application Publication 2005/0134336 discloses a method for dynamically setting a bias current within a receiver depending on whether a jammer is detected. U.S. Pat. No. 7,283,851 discloses reducing a bias current within a receiver depending on the operating condition of the receiver. Although these techniques function well in certain types of cellular telephones, the use of these techniques is often limited or precluded in other types of cellular telephones. For example in a full-duplex W-CDMA air interface system (Wideband Code Division Multiple Access), the Phase-Locked Loops (PLLs) of the receive and transmit local oscillators within the transceiver generally must remain locked during receive and transmit.

SUMMARY

A full-duplex transceiver circuit involves a transmitter, a receiver, a duplexer and an antenna. A transmit signal from the transmitter passes through the duplexer on its way to the antenna for transmission. A signal received on the antenna passes through the duplexer on its way to the input of the receiver. When the transmitter is transmitting, an amount of the transmit signal (in the transmit band) leaks through the duplexer and appears on the input of the receiver as transmit band leakage power. Deleterious consequences of this transmit band leakage power at the input of the receiver can generally be avoided by increasing power consumption in the receiver. Another problem in addition to transmit band leakage is that the transmitter outputs, in addition to the desired transmit band output signal, an amount of energy in the receive band. This energy leaks through the duplexer and appears on the input of the receiver as receive band noise. Deleterious consequences of such receive band noise can generally be avoided by increasing power consumption in the transmitter. Problems associated with receiving the transmit band leakage at the receiver input and problems associated with receiving the receive band noise at the receiver input can all, however, be reduced if more duplexer attenuation could be provided in the leakage signal path. Although the duplexer may be specified worst case only to have a certain transmit band rejection (also referred to as transmit band attenuation) and only to have a certain receive band rejection, it is recognized that the actual instance of the duplexer in a real instance of the transceiver circuit will typically exhibit a transmit band rejection and a receive band rejection that are better than specified by the duplexer manufacturer.

In a first novel aspect, the transmitter and the receiver of a transceiver are used to determine a transmitter-to-receiver isolation parameter. The transmitter-to-receiver isolation parameter characterizes a signal path, or part of a signal path, from the output of the transmitter to the input of receiver. Then, based on this determined transmitter-to-receiver isolation parameter, power consumption of a portion of the transceiver is set or adjusted in a second step. Examples of the transmitter-to-receiver isolation parameter include: a transmit band rejection of the signal path or a part of the signal path, a transmit band leakage power at the input of the receiver, a receive band rejection of the signal path or a part of the signal path, and a receive band noise at the input of the receiver.

In a second novel aspect, rather than possibly consuming excess power in the receiver in order to accommodate proper transceiver functioning in the presence of more transmit band leakage than may actually occur (due to the actual duplexer in the circuit possibly having better transmit band rejection than is specified by the duplexer manufacturer), transmit band leakage power at the input of the receiver is measured when the transmitter is set to transmit, in the transmit band, at its maximum output power setting. If the transmit band leakage power so measured at the input of the receiver is below a predetermined amount, then the receiver is set to operate with a lower power setting. The lower power setting of the receiver is tolerable due to the better-than-specified transmit band rejection of the particular duplexer in the circuit. If, on the other hand, if transmit band leakage power so measured in the circuit is above the predetermined amount, then the receiver is set to operate with a higher power setting.

The lower power setting may be due to supplying a portion of the receiver with a lower supply current, whereas the higher power setting may be due to supplying the portion of the receiver with a higher supply current. Alternatively, the lower power setting may be due to supplying the portion of the receiver with a lower supply voltage, whereas the higher power setting may be due to supplying the portion of the receiver with a higher supply voltage. Different combinations of supply voltages and supply currents can also be used to provide different power settings.

In one example, the receiver power setting is not changed during receive mode or transmit mode operation of the transceiver. The receiver power setting is not changed during a cellular telephone call. The measuring of transmit band leakage power and the changing of the receiver power setting may, for example, be performed during phone-level factory calibration and/or after power up of the transceiver circuit but before normal operation of the transceiver in the receive mode and the transmit mode so that the local oscillator of the receiver is not unduly perturbed during transceiver operation.

In a third novel aspect, rather than possibly consuming excess power in the transmitter in order to reduce receive band noise as output by the transmitter to a level necessary to accommodate a receive band noise leakage path of a smaller attenuation than may actually be present (due to the duplexer possibly having better receive band noise rejection than is specified), the actual receive band attenuation through the duplexer is measured. If the receive band attenuation so measured is more than (better than) a predetermined amount, then the transmitter is set to operate with a lower power consumption setting. Operation of the transmitter with the lower power consumption setting is tolerable because the duplexer has better receive band attenuation than specified. If, on the other hand, the receive band attenuation so measured is less than (worse than) the predetermined amount, then the transmitter is set to operate with a higher power consumption setting. The measuring of receive band attenuation and the changing of the transmitter power setting may, for example, be performed during phone-level factory calibration and/or after power up of the transceiver circuit but before normal operation of the transceiver in the receive mode and the transmit mode so that the local oscillator of the transmitter is not unduly perturbed during transceiver operation.

In a fourth novel aspect, rather than possibly consuming excess power in the transmitter in order to reduce receive band noise as output by the transmitter to a level necessary to accommodate a receive band noise leakage path of a smaller attenuation than may actually be present (due to the duplexer possibly having better receive band noise rejection than is specified), an estimate is made of the actual receive band noise power that will be present at the input of the receiver. This estimate is an estimate of the actual receive band noise power that would be present at the input of the receiver if the transmitter were outputting at an output power in the transmit band that corresponds to a maximum cellular telephone transmit output power on the antenna. This estimate can be based on a power measurement made by a power detector, where the power detector measures an amount of power somewhere along the signal path of the transmit signal from the transmitter output to the antenna. In addition to this power measurement, the estimate can also be based on a determined rejection (transmit band rejection and/or receive band rejection) of the circuitry between the output of the transmitter and the input of the receiver. If this resulting estimated receive band noise power is less than (better than) a predetermined amount, then the transmitter is set to operate with a lower power consumption setting. If, on the other hand, the estimated receive band power is higher than (worse than) the predetermined amount, then the transmitter is set to operate with a higher power consumption setting.

In another novel aspect, a set of transceivers is made, used or sold, where the transceivers of the set are all of a substantially identical hardware circuit design but are programmed to operate differently depending on different in-circuit performance characteristics of their duplexers. Each of these transceivers is operable in a plurality of channels, has a transceiver power consumption, and exhibits a transceiver power consumption versus channel pattern. The transceivers fall into transceiver categories based on their transceiver power consumption versus channel patterns. Such a transceiver power consumption versus channel pattern may, for example, involve the transceiver consuming one of two substantially different ranges of power in each of a plurality of channels. In addition, each of the transceivers includes a duplexer, and each of these duplexers has a transmitter-to-receiver isolation performance. An example of transmitter-to-receiver isolation performance is a combination of transmit band rejection and receive band rejection between the TX port of the duplexer and the RX port of the duplexer. These duplexers fall into duplexer categories based on their transmitter-to-receiver isolation performances. All transceivers in a transceiver category include duplexers that are in the same duplexer category. There is a one-to-one correspondence between the transceiver categories and the duplexer categories.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF THE DRAWINGS

FIG. 4 is a table that sets forth currents consumed in various parts of the receiver of the RF transceiver of FIG. 2 when the receiver is operating in its lower power consumption setting and when the receiver is operating in its higher power consumption setting.

FIG. 5 is a table that sets forth currents consumed in various parts of the transmitter of the RF transceiver of FIG. 2 when the transmitter is operating in its lower power setting and when the transmitter is operating in its higher power setting.

FIG. 11 is a flowchart of the second method.

FIG. 12 is a table that sets forth when the receiver of the mobile communication device of FIG. 10 is set, in accordance with the second method, to operate in its lower power setting and when it is set to operate in its higher power setting.

FIG. 15 is a table that sets forth when the transmitter of the mobile communication device of FIG. 13 is set, in accordance with the third method, to operate in its lower power consumption setting and when it is set to operate in its higher power consumption setting.

FIG. 22 is a flowchart of a method of testing a set of devices to detect usage of one of the first through fourth methods.

FIG. 23 is a diagram that illustrates an example of three transceiver power consumption versus channel patterns determined in carrying out the method of FIG. 22.

DETAILED DESCRIPTION

Figure 1:
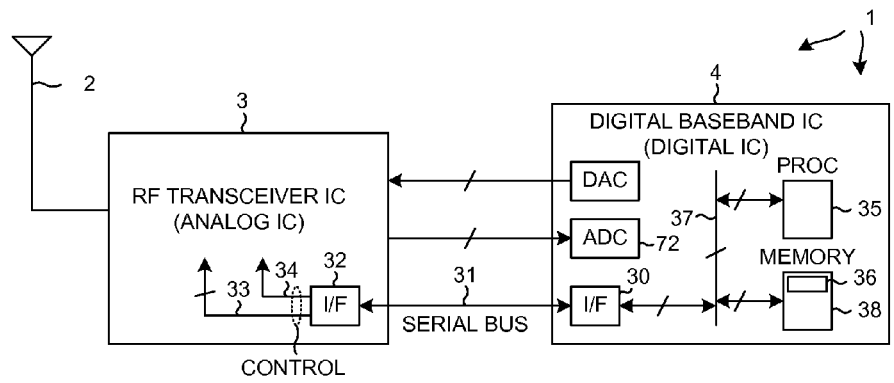
FIG. 1 is a simplified block diagram of a mobile communication device 1 that carries out two methods in accordance with two novel aspects.

FIG. 1 is a diagram of a mobile communication device 1 such as, for example, a cellular telephone handset. Device 1 includes (among other parts not illustrated) an antenna 2 usable for receiving and transmitting cellular telephone communications, an Radio Frequency (RF) RF transceiver integrated circuit 3, and a digital baseband processor integrated circuit 4. In some examples, the transceiver circuitry and the digital baseband circuitry is implemented on the same integrated circuit, but a two integrated circuit implementation is set forth here for illustration purposes.

Figure 2:
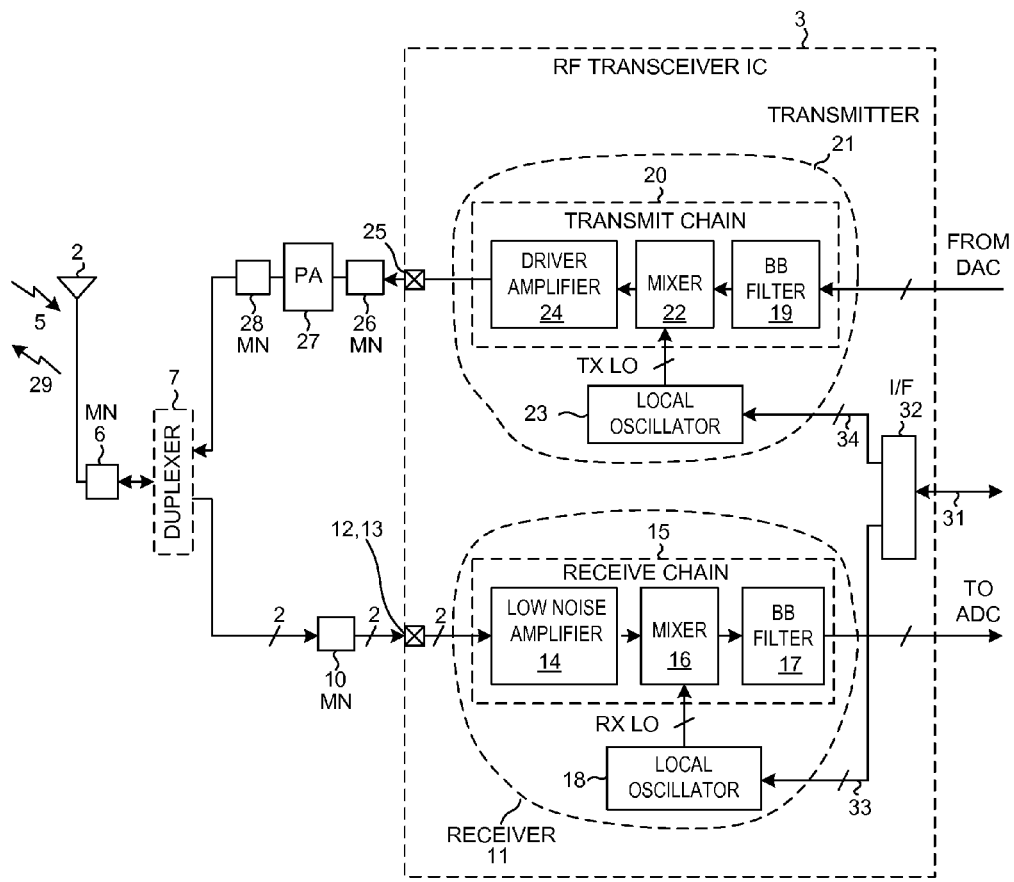
FIG. 2 is a more detailed diagram of a portion of the circuit of FIG. 1.

FIG. 2 is a more detailed diagram of the transceiver and antenna parts of the cellular telephone of FIG. 1. In one very simplified explanation of the operation of the cellular telephone, if the cellular telephone of FIG. 1 is being used to receive information as part of a cellular telephone call, then an incoming transmission 5 is received on antenna 2. The incoming signal passes through a matching network 6, a duplexer 7, a matching network 10, and into a receiver 11 of RF transceiver integrated circuit 3 via terminals 12 and 13. Terminals 12 and 13 are considered here to be the input of the receiver 11. The incoming signal is then amplified by a Low Noise Amplifier (LNA) 14 of a receive chain 15 portion of the receiver. After being downconverted in frequency by a quadrature mixer 16 and after being filtered by baseband filter 17, the information is communicated to the digital baseband processor integrated circuit 4 for analog-to-digital conversion and further processing in the digital domain. How the receive chain 15 downconverts is controlled by changing the frequency of a local oscillator signal RX LO generated by a local oscillator 18. The local oscillator is sometimes referred to as a frequency synthesizer.

If, on the other hand, the cellular telephone 1 is being used to transmit information as part of a cellular telephone call, then the information to be transmitted is converted into analog form in digital baseband processor integrated circuit 4. The analog information is supplied to a baseband filter 19 of a transmit chain 20 portion of a transmitter 21 in the RF transceiver integrated circuit 3. After filtering, the signal is upconverted in frequency by a quadrature mixer 22. The upconversion process is tuned and controlled by controlling the frequency of a local oscillator signal TX LO generated by a local oscillator 23 (also referred to as a frequency synthesizer). The resulting upconverted signal is amplified by a driver amplifier 24 and is output from the RF transceiver integrated circuit 3 via terminal 25. Terminal 25 is considered to be the output of the transmitter. The signal then passes through a matching network 26 and is amplified by an external power amplifier 27. The amplified signal passes through another matching network 28, duplexer 7, matching network 6, and is supplied onto antenna 2 for transmission as outgoing transmission 29. In one example, transmissions 5 and 29 are parts of a full-duplex W-CDMA cellular telephone communication. The local oscillators 18 and 23 of the receive and transmit chains are controlled by the digital baseband integrated circuit 4. Control information to control the local oscillators is sent to RF transceiver integrated circuit 3 via serial bus interface 30, across serial bus 31, and to serial bus interface 32, and onto control conductors 33 and 34. The control information is generated by a processor 35 executing a set of processor-executable instructions 36. Processor 35 accesses the instructions across bus 37 from a memory 38 (a processor-readable medium).

Figure 3:
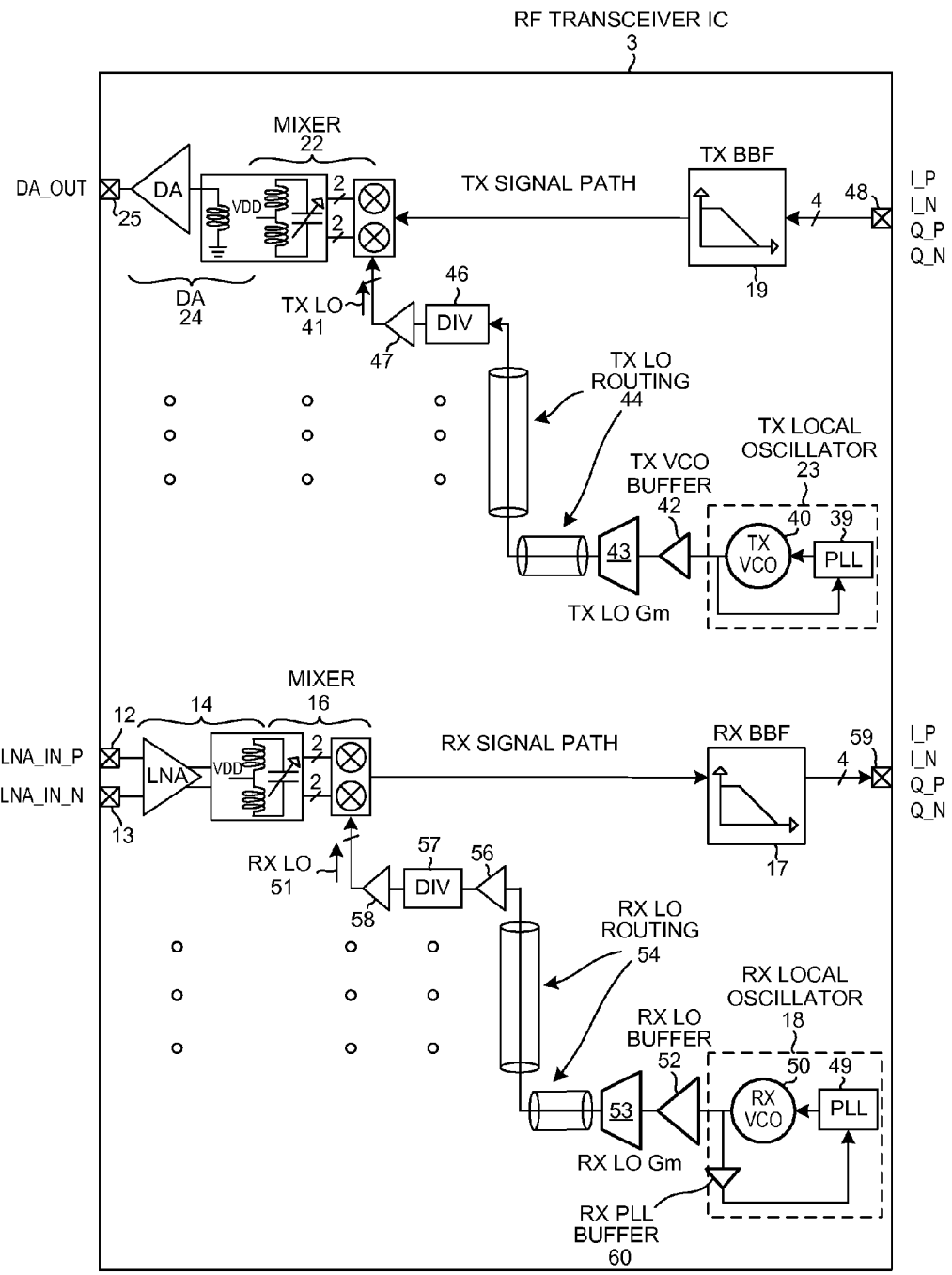
FIG. 3 is a diagram that shows certain parts of the transmitter and certain parts of the receiver in the RF transceiver integrated circuit 3 of FIG. 2.

FIG. 3 is a more detailed diagram of certain parts of the RF transceiver integrated circuit 3 of FIG. 2. The upper part of FIG. 3 illustrates a signal path through the transmit chain 20 as well as a signal path of the transmitter local oscillator signal TX LO from the local oscillator 23 to the mixer 22. The block 39 labeled PLL and the circle 40 labeled TX VCO together are the local oscillator 23 of FIG. 2. In one example, block 39 labeled PLL includes a phase detector, a loop filter, and a loop divider of a PLL whereas the VCO of the PLL is identified by circle 40. The local oscillator signal 41 TX LO generated by this local oscillator 23 is buffered by a buffer 42 TX VCO BUFFER. The buffered signal then passes through a transimpedance amplifier 43 TX LO Gm, through TX LO routing 44, and is divided down in frequency by divider 46. Divider 46 may, for example, be a divide-by-two circuit. The divided down signal is buffered by buffer 47 and is then supplied in quadrature form to quadrature mixer 22. Quadrature mixer 22 is the same upconverting quadrature mixer illustrated in FIG. 2. Divider 46 and buffer 47 are typically located in close proximity to mixer 22 on the integrated circuit. Local oscillator 23 may be located a substantial distance away. The path from output of the local oscillator 23 to the quadrature inputs of mixer 22 is referred to here as the TX LO path. In addition to this TX LO path, there is another signal path in the transmitter. This is the signal path of the information to be upconverted and transmitted. This signal path extends from terminals 48, through base band filter 19, through upconverting mixer 22, through driver amplifier 24, and onto terminal DA_OUT 25. The sets of three dots indicate that there may be multiple instances of the transmit chain signal path circuitry realized on RF transceiver integrated circuit 3.

The lower part of FIG. 3 illustrates certain parts of the receive portion of the RF transceiver integrated circuit 3 of FIG. 2. An RX LO signal path extends from RX local oscillator 18 to the quadrature inputs of the downconverting mixer 16 of the receive path. The block 49 labeled PLL and the circle 50 labeled RX VCO together are the local oscillator 18 of FIG. 2. In one example, the block 49 labeled PLL includes a phase detector, a loop filter, and a loop divider of a PLL whereas the VCO of the PLL is identified by circle 50. The local oscillator signal 51 RX LO generated by this local oscillator 18 is buffered by a buffer 52 RX VCO BUFFER. The buffered signal passes through a transimpedance amplifier 53 RX LO Gm, through RX LO routing 54, through buffer 56, and is divided in frequency by divider 57. Divider 57 may, for example, be a divide-by-two circuit. The divided down signal is buffered by buffer 58 and is then supplied in quadrature form to quadrature downconverter mixer 16. The downconverting quadrature mixer 16 is the same mixer illustrated in FIG. 2. Buffers 56 and 58 and divider 57 are typically located in close proximity to mixer 16 on the integrated circuit. The path from the input of RX LO BUFFER 52 to mixer 16 is referred to here as the RX LO path. The signal path of the information to be downconverted extends from terminals 12 and 13, through LNA 14, through downconverting mixer 16, through base band filter 17, and onto terminals 59. The sets of three dots indicates that there may be multiple instances of the receive chain signal path circuitry realized on the RF transceiver integrated circuit 3.

FIG. 4 is a table that sets forth the amounts of power consumed by the various circuits of the receiver LO path circuitry and the receiver signal path circuitry. The entire receiver 11 of the RF transceiver integrated circuit 3 consumes approximately 28 mA at 3.7 volts, whereas the RX LO path circuitry consumes approximately 18 mA at 3.7 volts. The RX LO path circuitry therefore consumes approximately sixty-five percent of all current consumed by the receiver.

FIG. 5 is a table that sets forth the amounts of power consumed by the various subcircuits in the TX LO path and the TX signal path. In one example, the entire transmitter 21 of the RF transceiver integrated circuit 3 consumes approximately 29 mA at 3.7 volts, whereas the TX LO path circuitry consumes approximately 15.5 mA at 3.7 volts. The TX LO path circuitry therefore consumes approximately fifty-five percent of all current consumed by the transmitter. This is true despite the existence of the external power amplifier 27 illustrated in FIG. 2. The external power amplifier, although it consumes substantial power when being utilized, is actually enabled and consuming that power only a very small fraction of the time under high output TX power conditions. More current is consumed driving the upconverter mixer 12 than is burned in the signal path itself.

Figure 6:
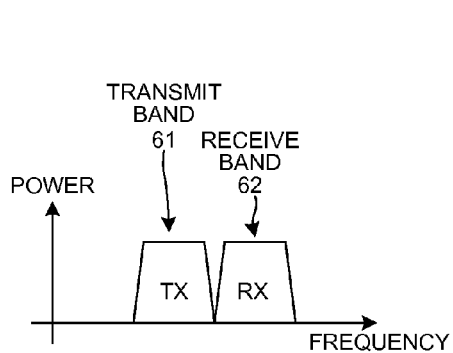
FIG. 6 is a diagram that illustrates the transmit band and the receiver band used in the W-CDMA full-duplex system of FIG. 1.

The circuitry of FIG. 3 is considered to determine the reasons behind the high power consumption in the various parts of the transceiver. The mobile communication device 1 communicates using the W-CDMA full-duplex air interface standard. In this protocol, there is a time when both the transmitter is transmitting in a transmit band and the receiver is receiving in a receive band. FIG. 6 is a diagram that illustrates the transmit band 61 and the receive band 62. In the W-CDMA full-duplex protocol employed, the transmit band 61 extends from 1920 MHz to 1980 MHz and the receive band 62 extends from 2110 MHz to 2170 MHz.

Figure 7:
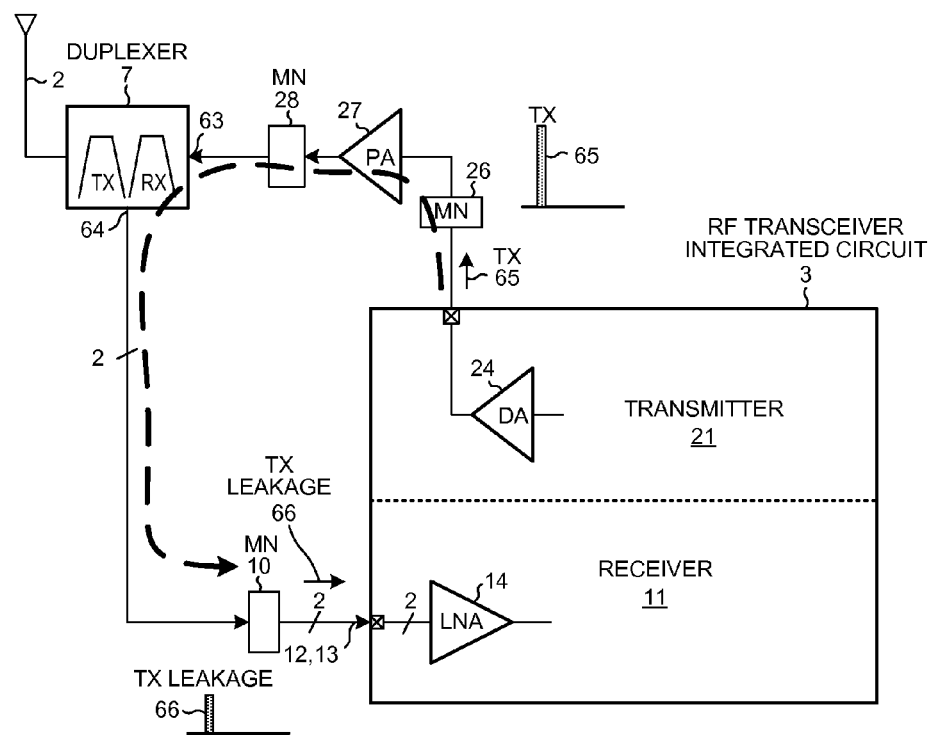
FIG. 7 is a diagram that illustrates a transmit leakage path.

FIG. 7 is a diagram that illustrates how this full-duplex operation can give rise to transmitter leakage. For TX band signals on the TX port 63 of the duplexer 7, there is limited rejection through the duplexer from the TX port 63 to the RX port 64. An amount of the transmit signal TX 65 as output from driver amplifier 24 therefore leaks through the duplexer 7 and out of RX port 64 and to the input 12,13 of the receiver. This amount of the TX signal is referred to as TX leakage 66. In many situations such as in UMTS, TX leakage is the largest jammer TX leakage at the input of the receiver is roughly −28 dBm and this is about 15 dB higher than any other jammer present. The largest jammer the receiver of integrated circuit 3 sees is the transmitter of the same transceiver. The large transmit leakage power at the input 12,13 of the receiver causes problems that generally require circuits in the receiver to consume a large amount of current in order to perform satisfactorily well in the presence of the transmit leakage. Four problems are described below.

Figure 8:
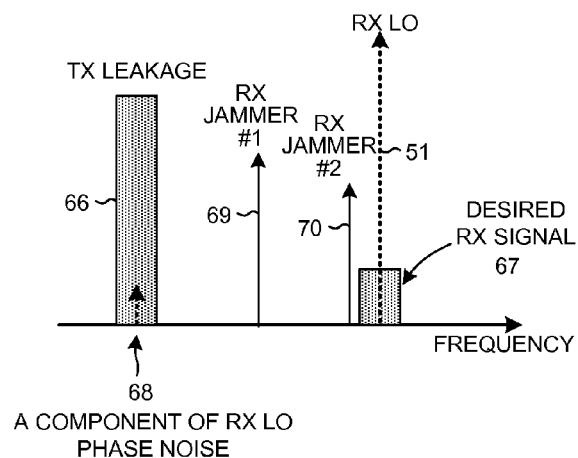
FIG. 8 is a diagram that illustrates signals involved in causing problems in the transceiver of FIG. 1.

FIG. 8 is a diagram that illustrates transmitter leakage 66, the RX LO signal 51, the desired RX signal to be received 67. The RX LO signal 51 should be a spectrally pure signal located in the center of the bandwidth of desired RX signal 67 so that the desired RX signal 67 will be properly downconverted. In practice, however, the RX local oscillator 18 outputs a RX LO signal 51 as well as phase noise. A component 68 of this phase noise may, for example, be at or close in frequency to the frequency of the TX leakage 66. The width of the blocks 67 and 66 that represent the RX signal and the TX leakage in FIG. 8 indicate that these signals have a bandwidth. In a desired operation, the RX LO 51 is mixed with the desired RX signal 67 to downconvert the desired RX signal 67 to base band frequency. Unfortunately, the component 68 of the RX LO phase noise is at such a frequency that it mixes with the strong TX leakage signal 66 in a similar way, resulting in an unwanted downconverted TX leakage in the base band. This unwanted signal corrupts the desired downconverted RX signal.

In general, there is a relationship between the amount of phase noise that accompanies the RX LO signal and the amount of power consumed by the local oscillator circuitry 18 that generates the RX LO signal and the amount of power consumed by the circuitry that supplies the RX LO signal from the local oscillator 18 to the mixer 16. If power consumption in the local oscillator 18 is reduced, then phase noise in the RX LO signal will generally increase. Similarly, if power consumption in the circuitry that communicates the RX LO from the local oscillator 18 to the mixer 16 is reduced, then phase noise in the RX LO signal will also increase. Accordingly, if a large amount of TX leakage is present, then phase noise in the RX LO signal should be kept low in order to keep the amount of downconverted TX leakage at acceptable levels. This requires high power consumption in both the local oscillator circuit 18 that generates the RX LO signal as well as in the circuitry that communicates the RX LO signal from local oscillator 18 to mixer 16.

Second, transmit leakage 64 also causes another problem. The downconverting mixer 16 of the receiver is not an ideal linear component, but rather exhibits nonlinearities. Due to these nonlinearities, second order distortion referred to as IIP2 occurs when TX leakage 66 is supplied to the nonlinear mixer. The resulting second order distortion lands in the signal band at zero frequency and corrupts the downconverted RX signal. In general, there is a relationship between the linearity of a mixer, such as mixer 16, and the strength of the signal driving the mixer. If the mixer is driven with a stronger RX LO signal then the mixer is seen to be more linear, whereas if the mixer is driven with a weaker RX LO signal then the mixer is seen to be less linear. Accordingly, to reduce the second order distortion problem, the RX LO signal 51 supplied to the RX mixer should be a strong signal. This requires that both the RX LO circuitry 18 and the RX LO signal path circuitry consume a relatively large amount of current.

Third, consider a jammer signal 69 that is located halfway in frequency between the frequency of the TX leakage 66 and the frequency of the RX LO 51. Ordinary IIP3 intermodulation between the TX leakage 66 and this RX jammer 51 will take place and will result in a signal component that overlaps the desired RX signal 67 in frequency. Both the desired RX signal 67 and this unwanted IIP3 component will downconvert together such that the unwanted IIP3 signal as downconverted will corrupt the desired downconverted RX signal. As set forth above, driving the downconverting mixer 16 with a stronger RX LO signal 51 causes the mixer to be more linear and therefore results in less of this undesired IIP3 intermodulation.

Fourth, consider a jammer signal 70 that is located closer in frequency to the frequency of RX LO 51. Triple beat (TB IIP3) cross-modulation mixing occurs between the modulated transmit leakage 66 and this RX jammer 70. The resulting third order distortion is at zero frequency and corrupts the downconverter RX signal. Again, if the downconverting mixer 16 of the receiver is driven with a strong RX LO signal then the mixer exhibits improved linearity and the TB IIP3 cross modulation problem is reduced in magnitude. As set forth above, however, driving the RX mixer 16 with such a strong RX LO signal requires both that the RX LO circuitry 18 consume a large amount of current and that the RX LO signal path circuitry that supplies the RX LO signal to the mixer 16 consume a large amount of current.

In considering the four problems described above, it is recognized that all four could be made less severe if the magnitude of the TX leakage 66 at the input 12, 13 of the receiver 11 could be reduced. It is also recognized that if a receiver were designed to operate satisfactorily well in the presence of a given amount of TX leakage, but if the actual amount of TX leakage were less than the amount of TX leakage for which the receiver was designed, then the high power consumption in the circuitry that generates and supplies the RX LO signal to the downconverting mixer would likely be unnecessarily high.

Figure 9:
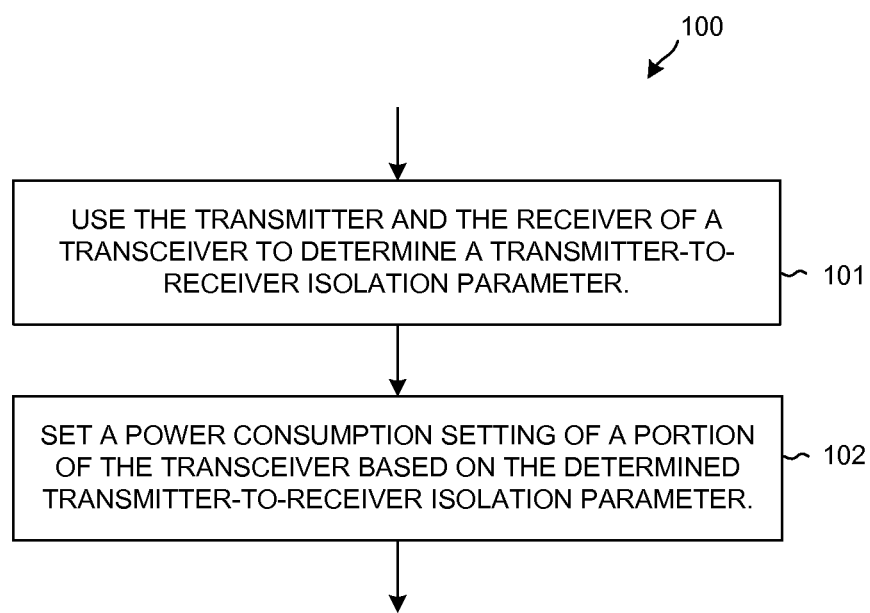
FIG. 9 is a flowchart of a first method.

FIRST METHOD: FIG. 9 is a flowchart of a first method 100 in accordance with a first novel aspect. In a first step (step 101), the transmitter and the receiver of a transceiver are used to determine a transmitter-to-receiver isolation parameter that characterizes a signal path from the output of the transmitter to the input of receiver. Examples of the transmitter-to-receiver isolation parameter include: 1) a transmit band rejection of the signal path or a part of the signal path, 2) a transmit band leakage power at the input of the receiver, 3) a receive band rejection of the signal path or a part of the signal path, and 4) a receive band noise at the input of the receiver. Then in a second step (step 102), a power consumption setting of a portion of the transceiver is set based on the transmitter-to-receiver isolation parameter determined in step 101.

For example, the leftmost column of FIG. 4 sets forth current consumption values for a higher receiver power consumption setting 110, the rightmost column of FIG. 4 sets forth current consumption values for a lower receiver power consumption setting 111, the leftmost column of FIG. 5 sets forth current consumption values for a higher transmitter power consumption setting 112, and the rightmost column of FIG. 4 sets forth current consumption values for a lower transmitter power consumption setting 113. In one usage of terminology, the actual settings are not the current consumption values but rather are the control bit values that control the various circuits to consume the indicated amounts of current.

In a first example of the method 100 of FIG. 9, the transmitter-to-receiver isolation parameter determined in step 101 is a determination of an amount of transmit band leakage power present on the input of the receiver when the transmitter is made to transmit (at a transmitter output power setting corresponding to a maximum cell phone transmit band output power) in the transmit band and the receiver is made to receive in the transmit band. If the determined transmit band leakage power is low, then the receiver is set in step 102 so that it operates using a lower power consumption setting, otherwise the receiver is set so that it operates using a higher power consumption setting. In a second example of the method 100 of FIG. 9, the transmitter-to-receiver isolation parameter determined in step 101 is a determination of receive band attenuation. The receive band attenuation is determined by making the transmitter transmit in the receive band and tuning the receiver to receive in the receive band. If the determined receive band attenuation is high, then the transmitter is set in step 102 so that it operates using a lower power consumption setting, otherwise the transmitter is set so that it operates using a higher power consumption setting. In a third example of the method 100 of FIG. 9, the transmitter-to-receiver isolation parameter determined in step 101 is a determination of an estimated amount of receive band noise that would be on the input of the receiver if the transmitter were transmitting in the transmit band (at a transmitter output power setting corresponding to a maximum cell phone transmit band output power). Step 101 may involve using a power detector to determine an amount of power output by the transmitter, and may involve using the transmitter and the receiver to determine a receive band attenuation of the signal path from the transmitter output to the receiver input. By adjusting power consumption of a portion of the transceiver downward in step 102, the consumption of an unnecessarily large amount of transceiver power is avoided in conditions in which the in-circuit duplexer performs better than specified.

SECOND METHOD: The circuit diagram of FIG. 10 and the flowchart of FIG. 11 set forth a circuit and a corresponding second method 200 in accordance with a second novel aspect. It is recognized that a commercially available duplexer has a transmit band leakage rejection (between its TX port and its RX port) that is typically more than 5 dB better than the transmit band leakage rejection value specified by the duplexer manufacturer. Designing the RF transceiver to perform adequately well under conditions of an amount of transmit band leakage power at input of the receiver that is actually of substantially higher magnitude than will actually be present on the input during real circuit operation would result in an unnecessarily high power consumption. If in an actual transceiver circuit the duplexer actually rejects the transmit band TX signal better than specified and lets less transmit band leakage through and back to the receiver input than is required for proper transceiver operation, then current consumption in the receiver can be reduced while still satisfying required transceiver performance parameters. Power consumption in an actual transceiver should not be made unnecessarily high in order to operate using a specified duplexer transmit band leakage rejection value that not as good as the duplexer transmit band rejection of the actual duplexer that is in the system as manufactured.

FIG. 11 is a flowchart that sets forth the second method 200. Method 200 involves determining the actual amount of transmit band leakage power at the receiver input and then throttling back the power setting of the receiver if the magnitude of transmit band leakage power is low enough that a higher power setting of the receiver is not necessary to meet transceiver performance requirements. In a first step (step 201), the transmitter 21 is tuned to output a transmit band signal. In a second step (step 202), the transmitter 21 is made to output the signal at the transmitter's maximum permissible output power. This maximum permissible output power setting of the transmitter is the setting that corresponds to the largest amount of output transmit band transmit power the cellular telephone is allowed to output from its antenna. In a third step (step 203), the receiver 11 is tuned to receive in the transmit band. Normally in a full-duplex cellular telephone transceiver the receiver is not made to receive in the same transmit band that the transceiver is using, but in method 100 the receiver 11 is made to receive signals in the transmit band. Receiver 11 is the main receiver ordinarily used to receive cellular telephone communications in the receive band.

Figure 10:
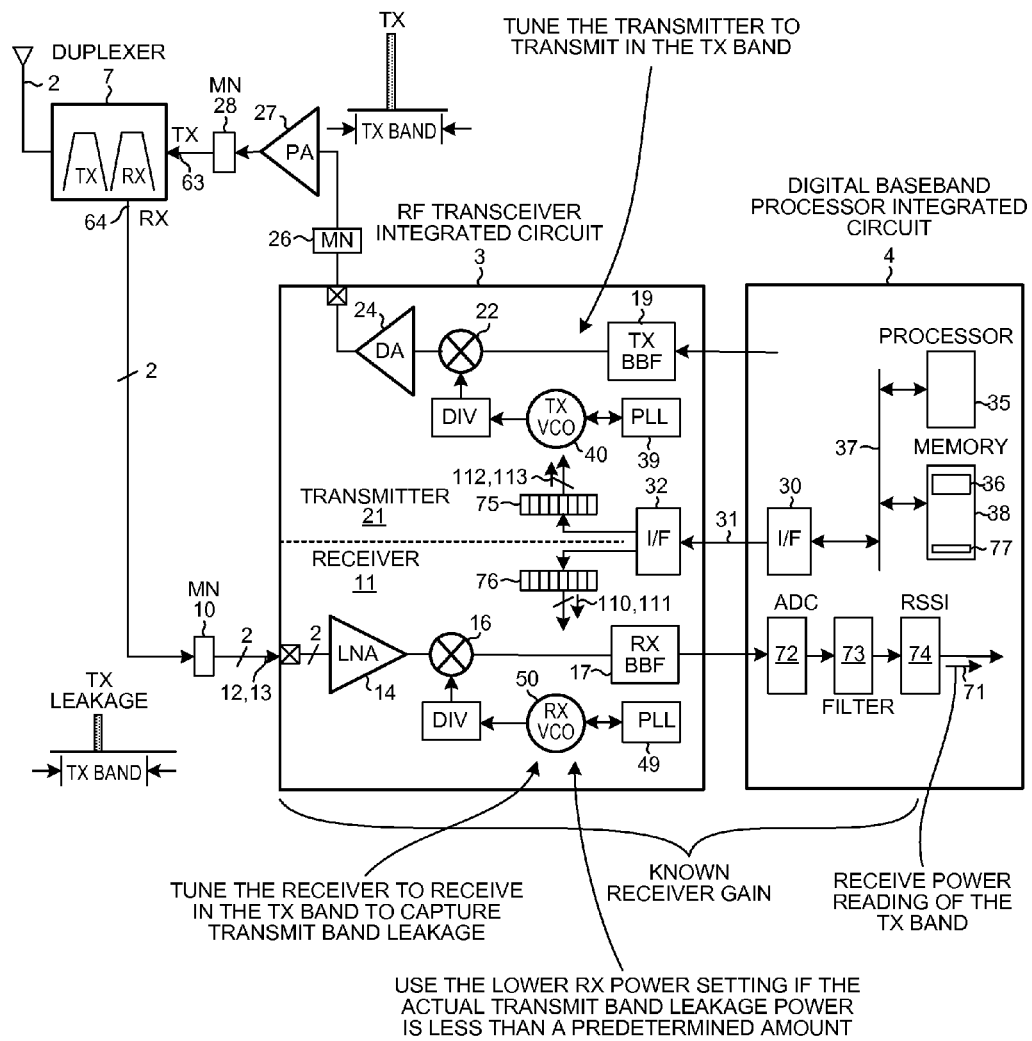
FIG. 10 is a diagram that illustrates a mobile communication device that carries out a second method.

In a fourth step (step 204), the amount of transmit leakage power (in the transmit band) at the input 12, 13 of the receiver 11 is determined. In one example, the amount of transmit leakage is determined by obtaining a receive power reading 71. As illustrated in FIG. 10, digital baseband processor integrated circuit 4 includes an Analog-to-Digital Converter (ADC) 72 that receives and digitizes the receive signal from the RF transceiver integrated circuit 3. A hardware filter 73 filters the digitized signal as output by ADC 72. A circuit 74 referred to as a Receive Signal Strength Indicator circuit (RSSI circuit) receives the filtered digitized receiver signal and outputs an RSSI digital value. This RSSI value is a receive power reading 71 and is indicative of the power of the signal being received by the receiver. Processor 35 reads this receive power reading 71 from the output of the RSSI circuit 74 via bus 37 under software control.

In one example of the method 200 of FIG. 11, software 36 executed by processor 35 controls the transmitter 21 by making appropriate writes to control register 75 via interface 30, serial bus 31, and interface 32. Similarly, software 36 controls the receiver 11 by making appropriate writes to control register 76 via interface 30, serial bus 31, and interface 32. In carrying out step 204 of method 200 of FIG. 11, this software 36 reads the RSSI digital value 71 as generated by RSSI circuit 71 and uses a receiver gain value 77 to calculate the signal strength of the TX leakage 66 at the input 12, 13 of the receiver 11. This receiver gain value 77 is a value that is determined during calibration and testing of the cellular telephone after cellular telephone manufacture and before shipment of the cellular telephone to a customer. The receiver gain is typically determined by monitoring receiver performance when a test signal of known power is supplied to the input of the receiver. Determining receiver gain in this way is a standard operation in the manufacture of cellular telephones. Once the receiver gain value 77 is determined in such a calibration procedure, it is stored in memory 38 in the digital baseband processor integrated circuit 4 for later use. As an example, if the RSSI value 71 indicates a RSSI signal strength of +20 dBm, and if the receiver gain value 77 is 50 dB, then the software 36 calculates the TX leakage signal strength at the receiver input 12,13 to be −30 dBm.

It is, however, generally the case that the receiver gain is measured in the calibration procedure when the receiver is receiving receive band signals. The resulting receiver gain value 77 is generally not accurate if the receiver is receiving signals in the transmit band as in the method 200. Accordingly, in some examples the receiver gain value 77 is multiplied by a correction factor to obtain the receiver gain value actually used in step 204 of the method 200.

Next, if software 36 determines (step 205) that the transmit band leakage power is less than a predetermined amount (for example, less than −35 dBm), then software 36 writes to control register 76 if necessary to cause a lower RX power setting to be used to configure the receiver (step 206). If, on the other hand, software 36 determines (step 205) that the transmit band leakage power is equal to or more than the predetermined amount (for example, −35 dBm or more), then software 36 writes to control register 76 if necessary to cause a higher RX power setting to be used to configure the receiver (step 207). In one specific example, the predetermined amount is −35 dBm and the receiver 11 is designed to have acceptable performance when operating in its lower power setting in the presence of up to −35 dBm of TX leakage on its input 12, 13.

In the particular example of the circuit of FIG. 10, the power setting of receiver 11 is determined by a set of power setting configuration bits stored in control register 76. These bits are supplied to various corresponding sub-circuits of the receiver illustrated in FIG. 3 by conductors (not shown) so that the contents stored in register 76 will set the power consumption in those various sub-circuits of the receiver. The rightmost column in FIG. 4 sets forth the current consumption of these sub-circuits of receiver 11 when the receiver 11 is operating in its lower power setting. Software 36 determines the values of the power setting configuration bits in accordance with method 100 and writes the bits into register 76 by performing an appropriate serial bus write. In one example, the steps of determining whether transmit leakage is above or below a predetermined amount are carried out multiple times, once for each of a plurality of transmitter frequency ranges (channels). For each such transmitter frequency range, a determination is made as to which of two receiver power settings will be used and this information is stored for later use. Depending on the specific implementation, power setting information on which power setting to use in a given circumstance is either stored in memory 38 on the digital baseband processor integrated circuit 4 or is stored in a memory (not shown) on the RF transceiver integrated circuit 3. The method 200 is carried out when the cellular telephone is not actively being used in a transmit mode or in a receive mode. Once the cellular telephone is in ordinary receive mode or transmit mode, the receiver power setting is not changed until receive mode or transmit mode operation ceases. Unlocking the RX VCO during normal operation of the cellular telephone is avoided by not changing the receive power setting during normal operation of the cellular telephone.

FIG. 12 is a table that illustrates when receiver 11 is set to operate using its lower power setting and when the receiver is set to operate using its higher power setting. As indicated by the bottom row of the table, if the method 200 results in a determination that the TX leakage power on the receiver input is more than −35 dBm when the transmitter is transmitting at maximum power, then the higher power RX setting is used. As indicated by the next row up in the table, if the method 200 results in a determination that the TX leakage power on the receiver input is less than −35 dBm when the transmitter is transmitting at maximum power, then the lower power RX setting is used. The upper two rows of the table indicate representative receive power reading values and receiver gain values in two different operating situations.

THIRD METHOD: As indicated in FIG. 3 and the table of FIG. 5, most of the power consumed in transmitter 21 is consumed in the local oscillator 23 and the signal path that communicates the TX LO signal 41 from the local oscillator 23 to the upconverting mixer 22. One reason for this large amount of power consumption is that the transmitter outputs noise in addition to the desired TX signal. Some of this noise is in the receive band. This "receive band noise" is amplified by power amplifier 27 along with the desired TX signal and is supplied onto the TX port 63 of duplexer 7. Some of this receive band noise then leaks through the duplexer and appears on the input 12, 13 of the receiver 11. Unlike the situation described above in connection with the second method 200 where the leakage was in the transmit frequency, here in the situation of the third method 300 energy leaking through the duplexer 7 is directly in the receive band. This energy is in the same band as the desired RX signal and therefore will be received by receiver 11 along with the desired RX signal. This receive band noise must therefore be kept at a low power level in order for the transceiver to work properly. In general, there is a relationship between the amount of power consumed by the transmitter local oscillator 23 and in the TX LO signal path from the transmitter local oscillator 23 to the mixer 22 versus the amount of receive band noise that is output by transmitter 21. The amount of receive band noise output by transmitter 21 can be reduced by burning more power in the transmitter local oscillator that generates the TX LO signal 23 and in the circuitry that supplies the TX LO signal to the mixer 22.

It is recognized that a commercially available duplexer has receive band rejection (rejection of receive band energy between its TX port 63 and its RX port 64) that is typically more than 5 dB better than the receive band rejection value specified by the duplexer manufacturer. Requiring the transmitter to generate a TX LO having a low amount of receive band noise so that the RF transceiver will perform adequately well under conditions of the duplexer 7 only having a receive band rejection of the specified amount would impose unnecessary requirements on the TX LO in a typical circuit because the duplexer 7 would actually typically exhibit substantially better receive band rejection. The amount of receive band noise actually reaching the input 12, 13 of receiver 11 would be lower than necessary. In a given instance of the circuit, however, it is not known whether the duplexer 7 will have better receive band rejection than is specified.

Figure 13:
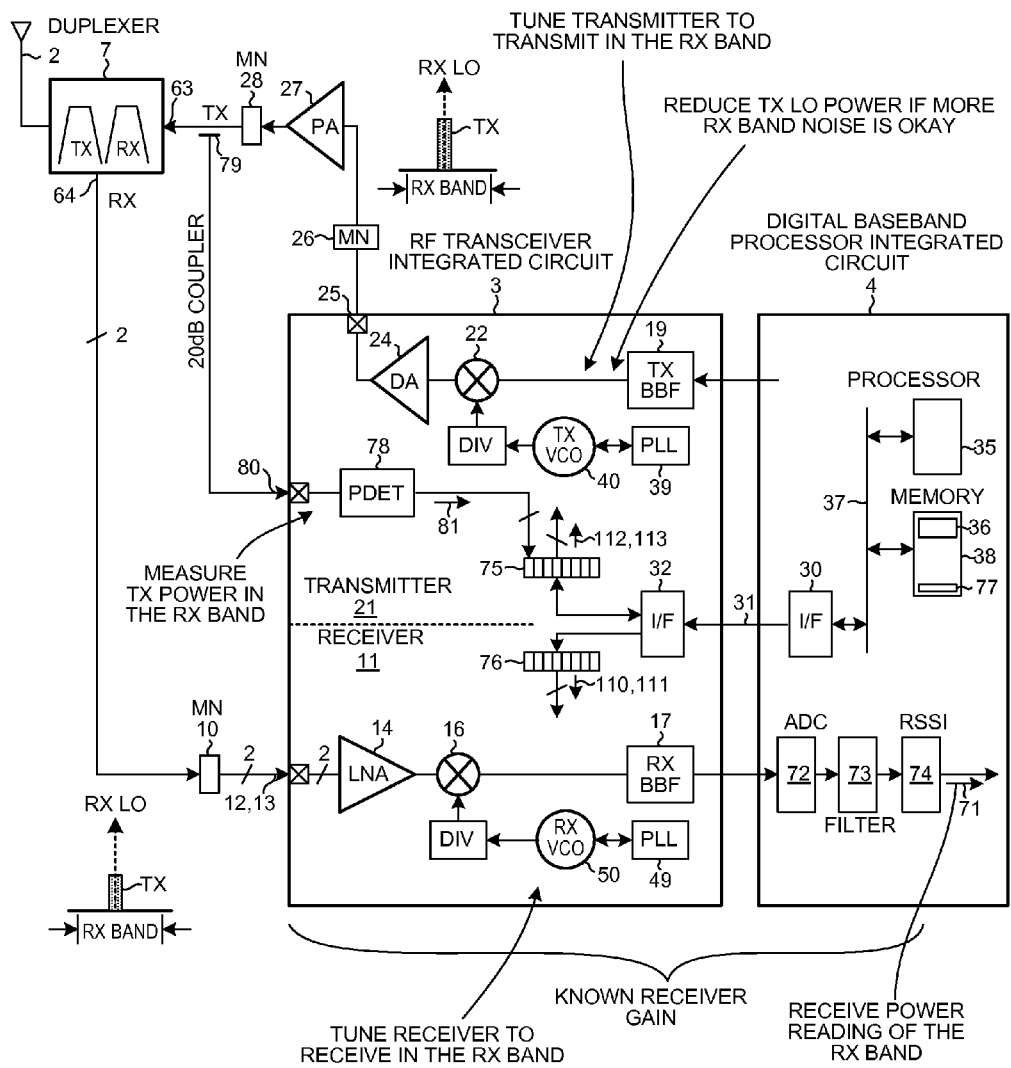
FIG. 13 is a diagram that illustrates a mobile communication device that carries out a third method.
Figure 14:
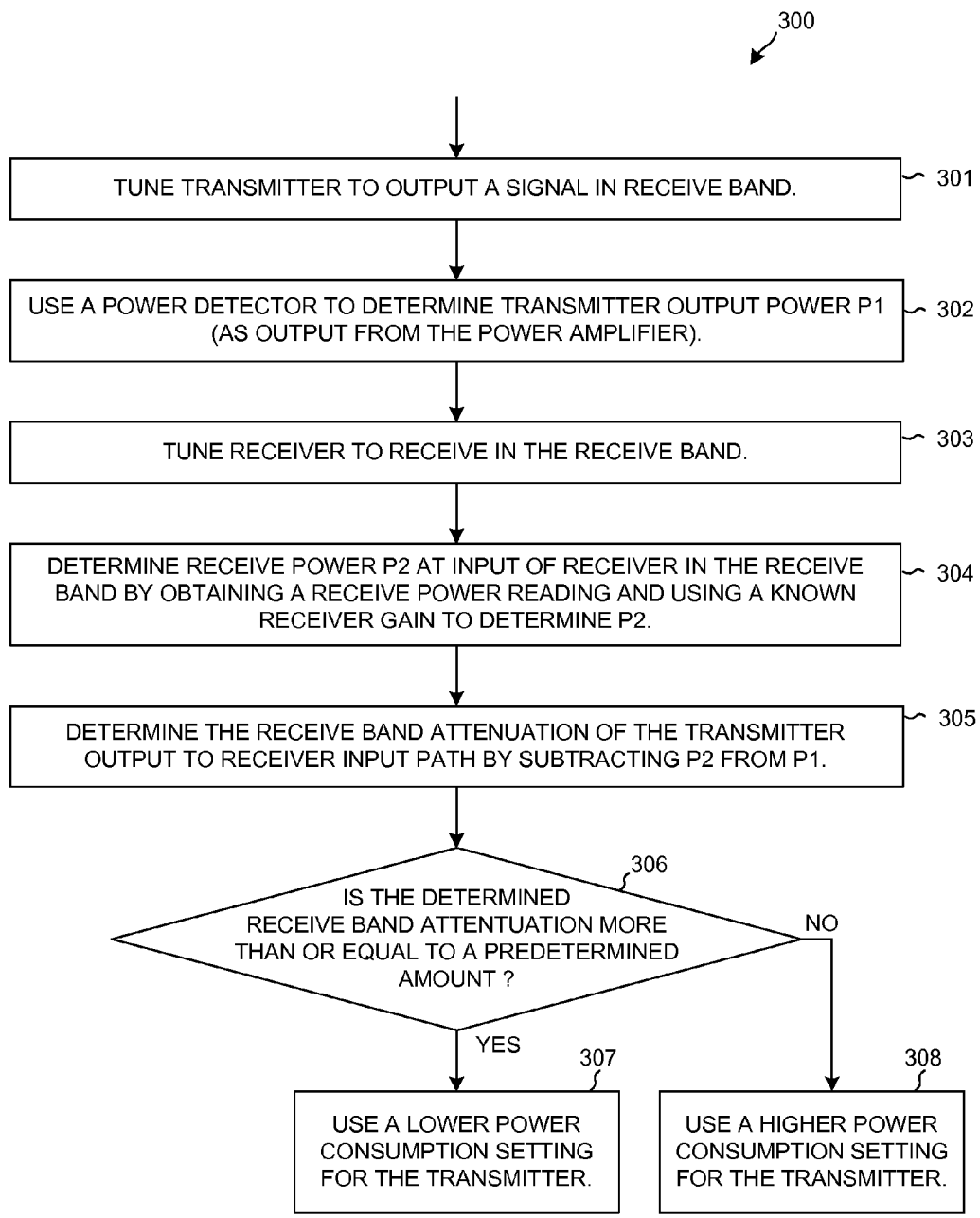
FIG. 14 is a flowchart of the third method.

In accordance with a third novel aspect, the receive band rejection of the signal path from the power amplifier output, through the duplexer 7, and to the input 12, 13 of the receiver 11 is measured in the actual circuit, and the transmitter 21 is set to use the lowest power setting that will result in a satisfactorily low amount of receive band noise at the receiver input 12, 13. The circuit diagram of FIG. 13 and the flowchart of FIG. 14 set forth a circuit and a corresponding method 300 in accordance with this third novel aspect. In a first step (step 301 of FIG. 14), transmitter 21 is tuned to output a signal in the receive band. In a second step (step 302), a power detector 78 is used to determine the transmitter output power P1. In the circuit diagram of FIG. 13, a 20 dB broadband coupler 79 couples a small portion of the transmit power as supplied to the transmit port 63 of duplexer 7 back to terminal 80 and to the power detector circuit 78. In many RF transceiver designs, the coupler 79 and terminal 80 and power detector 78 are provided and used for the purpose of measuring transmit output power and ensuring that it is within legal limits. In accordance with the method 300 of FIG. 14, this existing broadband power detector circuitry is put to another use in method 300. Processor 33 reads the power detector output value 81 from readable bits in register 75 by performing a serial bus read via interface 30, serial bus 31, and interface 32. The power detector circuit is used to measure the amount of power the transmitter transmits in the receive band because the transmitter is not calibrated for receive band operation. The gain of the power amplifier 25 is also generally not known for operation in the receive band. Although the transmitter 21 and the power amplifier 25 can be tuned to output a signal in the receive band, the output power for a given power setting is not known with adequate accuracy. Accordingly, power detector 78 is used to obtain an accurate transmit output power P1 value.

In a third step (step 303), receiver 11 is tuned to receive in the receive band. In a fourth step (step 304), the receive power P2 at the input 72 of receiver 11 in the receive band is determined As set forth above in connection with FIG. 10, the RSSI circuit 74 of the digital baseband integrated circuit 4 outputs a receive power reading 71. In addition, as set forth above, the receiver is calibrated at the time of manufacture, a receiver gain is determined, and this determined receiver gain value 77 is stored in the digital baseband integrated circuit 4. In step 204, the receive power reading 71 and the known receiver gain 77 are used to determine the receive band power P2 that is received at the input 12, 13 of receiver 11. In a fifth step (step 305), the receive band attenuation of the path through duplexer 7 from the TX port 63 to RX port 64 and to the input 12, 13 of the receiver is determined by subtracting P2 from P1. If this determined receive band attenuation is more than (better than) a predetermined amount (step 306), then transmitter 21 is set to operate at a lower power consumption setting (step 307). This situation corresponds to the duplexer having better receive band rejection than specified. Even though power consumption in the transmitter is set at a low value and the TX LO therefore involves more receive band noise, the duplexer 7 functions better than specified in attenuating this receive band noise so that the amount of receive band noise at the input 12, 13 of the receiver 11 is nevertheless within acceptable levels. If, however, the determined receive band attenuation (step 306) is not more than the predetermined amount, then transmitter 21 is set to operate at a higher power consumption setting (step 308). This situation corresponds to the duplexer having a receive band rejection as specified. Transmitter 21 is therefore made to consume a relatively large amount of power such that receive band noise accompanying the TX LO signal is reduced and as a result the amount of receive band noise received at the input 12, 13 of receiver 11 is an acceptable amount.

Software 36 executed by processor 35 causes the various steps of the method 300 to be carried out. The software 36 controls transmitter 21 by writing appropriate information into bits of control register 75 via interface 30, serial bus 31, and interface 32. The power detector reading 81 as output by power detector 78 is stored in certain bits of register 75. The software 36 reads this power detector reading 81 from register 75 in step 202 by performing an appropriate serial bus read of register 75. Similarly, the software 36 controls receiver 11 by writing appropriate configuration and control information into appropriate bits in control register 76 via interface 30, serial bus 31, and interface 32. The software 36 obtains the receive power reading 71 from RSSI circuit 74 by reading the value output by RSSI circuit 74 across bus 37. The receiver gain value 77 is stored in memory 38 for use by the software 36 when the software 36 executes and carries out the method 300 of FIG. 14.

FIG. 15 is table that illustrates when transmitter 21 is set to operate using its lower power consumption setting and when transmitter 21 is set to operate using its higher power consumption setting. As indicated by the bottom row of the table, if the method 300 results in a determination that the receive band attenuation of the signal path is less than (worse than) 60 dB then the transmitter is set to operate in the higher power consumption setting. As indicated by the next row up in the table, if the method 300 results in a determination that the receive band attenuation of the signal path is equal to or higher than (better than) 60 dB then the transmitter is set to operate in the lower power consumption setting.

Figure 16:
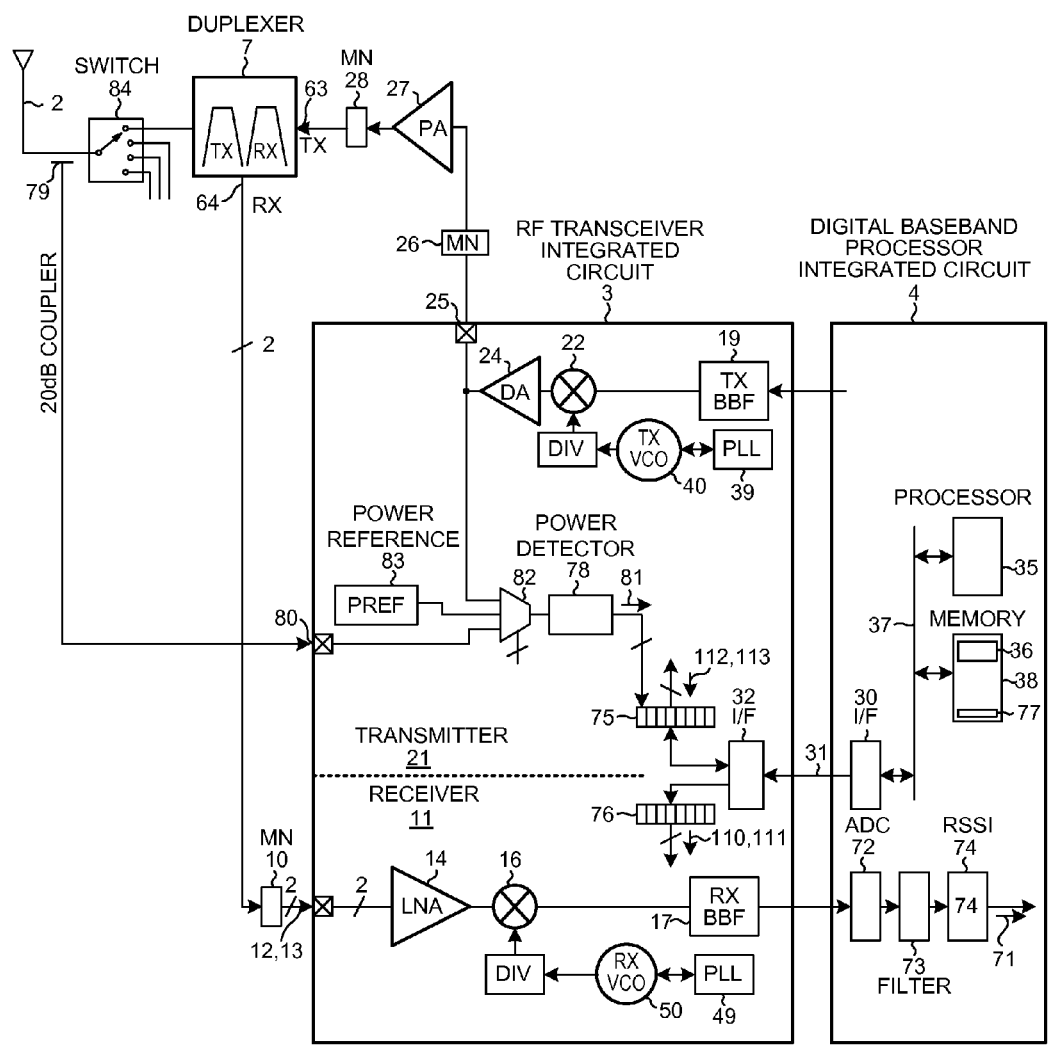
FIG. 16 is a diagram that illustrates a mobile communication device that carries out a fourth method.

FOURTH METHOD: The circuit diagram of FIG. 16 and the flowchart of FIG. 17 set forth a circuit and a corresponding method 400 in accordance with a fourth novel aspect. The circuit of FIG. 16 differs from the circuit of FIG. 13 in that the circuit of FIG. 16 has an additional 3:1 analog multiplexer 82 and a power reference source 83. The 3:1 analog multiplexer 82 is controlled to couple a selected one of the signal as output from the driver amplifier 24, the signal as output by the power reference source 83, and the signal as output from coupler 79 and terminal 80 to the input of the power detector 78. By appropriate control of multiplexer 82, the calibrated and known amount of power from power reference source 83 is initially coupled to the input of power detector 78 and the value 81 output by the power detector is read and is used to calibrate the output of the power detector. Power detector 78 is a broadband power detector that measures the power level on its input over both the transmit band and the receive band. Coupler 79 in this example is disposed between the switch 84 and the antenna 2. Although coupler 79 is shown in FIG. 16 disposed between switch 84 and antenna 2, the method 400 may be practiced with the coupler 79 disposed in other places in the signal path of the transmitter output signal. For example, in one example the coupler 79 is disposed between the output of the power amplifier 27 and the TX port of the duplexer 7.

Figure 17:
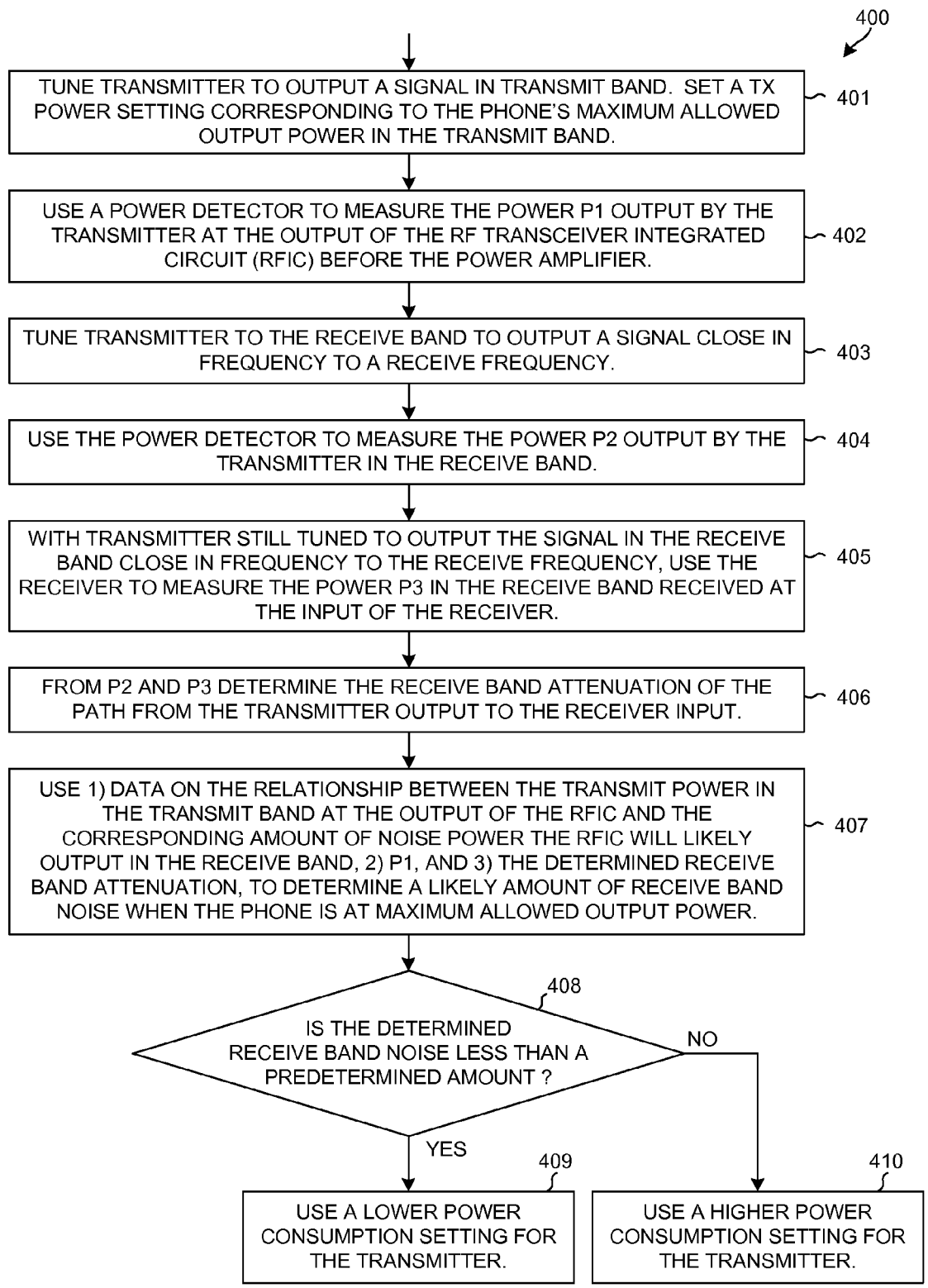
FIG. 17 is a flowchart of the fourth method.

The fourth method 400 is set forth in FIG. 17. In a first step (step 401), the transmitter 21 is tuned to output a signal in the transmit band 61. Transmitter 21 is set to have a transmit power output setting that corresponds to the cellular telephone's maximum allowed output power from the antenna in the transmit band. In a second step (step 402), analog multiplexer 82 is controlled to couple the signal as output by driver amplifier 24 (see FIG. 16) to the input of power detector 78 so that the power detector 78 can measure the transmit band power P1 as output by the RF transceiver integrated circuit 3. The measured power value P1 is indicative of the amount of transmit band power as output by the transmitter of the transceiver integrated circuit 3 to the input of the external power amplifier 27. In a third step (step 403), the transmitter is tuned to the receive band so that the transmitter outputs a signal close in frequency to the receive frequency. The transmitter may, for example, be tuned to the receive frequency plus one megahertz. The transmitter remains set to have the transmit output setting that corresponds to the phone's maximum allowed transmit output power at the antenna. Analog multiplexer 82 is controlled to couple the signal as output by driver amplifier 24 to the input of power detector 78 so that the power detector 78 can measure (step 404) the receive band power P2 as output by the RF transceiver integrated circuit 3. Next (step 405), with the transmitter still tuned to the frequency close to the receive frequency (or tuned to the receive frequency), the receiver 11 is used to measure the power P3 in the receive band at the input of the receiver. As explained above in connection with methods 200 and 300, this is done by obtaining a receive power reading 71. From the receive power reading 71 and a known receiver gain value 77 that was previously stored in memory 38, the power P3 is determined. Next (step 406), the receive band attenuation (also referred to as receive band rejection) of the signal path from the output of transmitter 21 to the input of receiver 11 is determined based on power P2 and power P3. Next (step 407), a determination is made of an estimated amount of receive band noise power that will be present on the receiver input 12, 13 when the phone is at its maximum allowed transmit output power. This determination is made using: 1) stored and known data on the relationship between the transmit power in the transmit band at the output of the RF transceiver and the corresponding amount of receive band noise power the RF transceiver will likely output in the receive band, 2) power P1 (the measured power in the transmit band at the output of the RF transceiver when the phone is set to transmit at its maximum allowed transmit power), and 3) the determined receive band attenuation. Next (step 408), if the determined amount of receive band noise power is less than a predetermined amount then the transmitter is set (step 409) to operate using a lower power consumption setting, whereas if the determined amount of receive band noise power is more than or equal to the predetermined amount then the transmitter is set (step 410) to operate using a higher power consumption setting.

In some examples, the transmit band 61 is made up of numerous channels. Transmit band 61 may, for example, be twenty-five megahertz wide and may involve twenty-five constituent one megahertz wide channels. Method 400 of FIG. 17 is carried out once for each of these channels such that a transmitter power consumption setting is obtained for each channel. As the cellular telephone is used, the transmit channel being used may change. Upon such a change, the transmitter 21 is set to operate with the transmitter power consumption setting determined in method 400 for the channel. Once perturbations and disturbances in the transmitter due to the changed transmitter power setting have died out, the transceiver can then be used to engage in a cellular telephone call using the channel. The transmitter power consumption setting is not changed during the call in a case in which W-CDMA is used.

Figure 18:
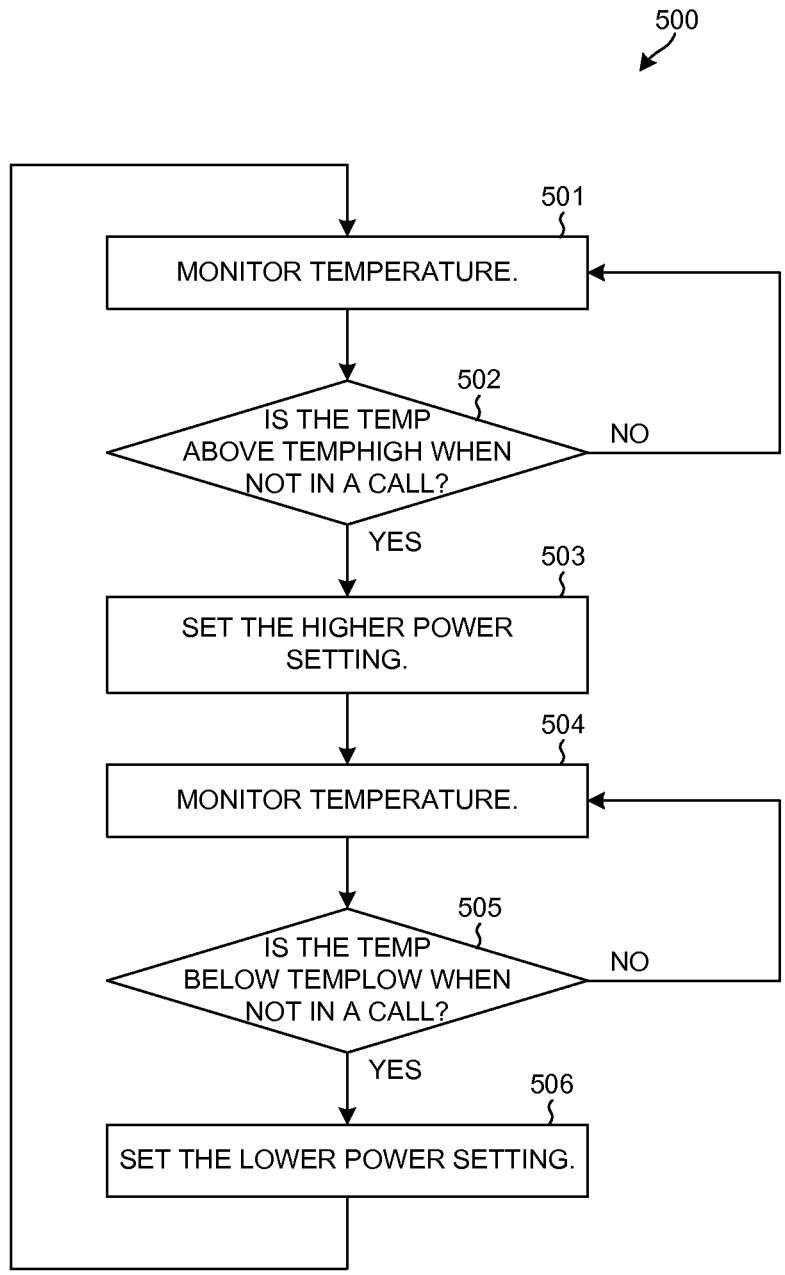
FIG. 18 is a flowchart of a method of changing the power consumption setting based on changes in a detected temperature.

FIG. 18 is a flowchart of a fifth method 500. In each of the methods 100, 200, 300 and 400, the result of the method is the setting of a portion of the transceiver into one of two power consumption settings. In the fifth method, the power consumption setting set can be one of two possible power consumption settings. The particular power setting used is the one appropriate for the detected temperature. In addition, as the transceiver operates, the power setting can be changed as a result of a temperature change. Accordingly, the lower power consumption setting of step 409 of the method 400 of FIG. 17 can be one of two possible power consumption settings. Which of the two is used depends on the detected temperature. Similarly, the higher power consumption setting of step 410 of the method 400 of FIG. 17 can be one of two possible power consumption settings. Which of the two is used depends on the detected temperature. Over time, as the transceiver operates, the power consumption setting can be made to change even if step 408 is not repeated.

In the fifth method, the temperature of the transceiver is monitored (step 501). If the detected temperature is not above a TEMPHIGH value when the transceiver is not in a call (step 502), then process flow returns to step 501. If the detected temperature is above the TEMPHIGH value when the transceiver is not in a call (step 502), then the higher power setting is set. In the example of method 400 of FIG. 17, if the result of step 408 was a "yes" determination, then there are two possible power consumption settings that could be used in step 408 as determined by the result of step 502 of FIG. 18. The higher power one of the two is set as indicated by step 503 of FIG. 18. Process flow returns to monitoring temperature (step 504). If the detected temperature is not below a TEMPLOW value when the transceiver is not in a call (step 505), then process flow returns to step 504. If the detected temperature is below the TEMPLOW value when the transceiver is not in a call, then the lower of the two possible power consumption settings that could be used in step 408 is selected (step 506). The difference between TEMPHIGH and TEMPLOW provides an amount of hysteresis in the changing of the power setting due to changes in temperature. In one example, the temperature detector is part of the RF transceiver integrated circuit 3 and is read by the processor 35 of the digital baseband integrated circuit 4. Processor 35 executes a set of processor-executable instructions stored in memory 38 so as to cause processor 35 to carry out the steps of FIG. 18. The processor can change the power setting as determined by method 500 by writing the appropriate control value into the appropriate one of control registers 75 and 76 via serial bus 31.

Although changes in temperature only change the power setting between two power consumption settings in the example of FIG. 18, in other examples changes in temperature are made to change the power settings between three or more possible power consumption settings. Similarly, although the result of each of the methods 100, 200, 300 and 400 is the setting of a portion of the transceiver into one of two power consumption settings based on whether a transmitter-to-receiver isolation parameter is above or below a predetermined value, the methods can be extended to result in the setting into one of three or more possible power consumption settings based on whether the transmitter-to-receiver isolation parameter is or is not within a corresponding one of three or more ranges of parameter values. The use of temperature to change the power consumption setting can be practiced in combination with, or separately from, other methods of setting power consumption settings based on determined magnitudes of transmitter-to-receiver isolation parameters.

Although two temperature switching points TEMPHIGH and TEMPLOW are used in the specific example of FIG. 18 to provide an amount hysteresis in the changing of the power consumption setting, other ways of providing hysteresis are used in other specific examples. In one example, a single temperature switching point is used, but a timer is used to prevent rapid oscillation between power consumption settings. The power consumption setting is only allowed to change after a certain amount of time, as determined by the timer, has passed after the power consumption setting was last changed.

Figure 19:
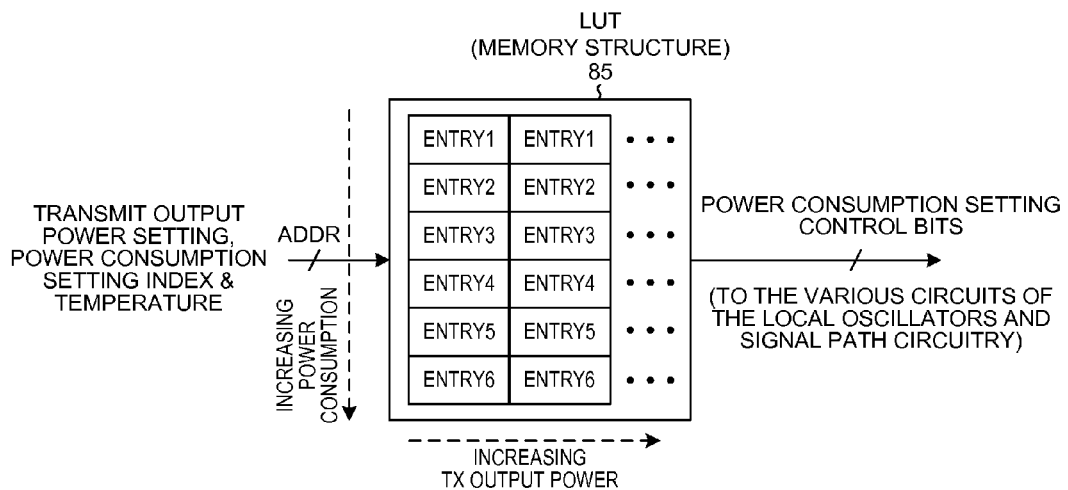
FIG. 19 is a diagram of a Look Up Table (LUT) usable for looking up the appropriate power consumption setting bits to be used.

FIG. 19 is a diagram that shows how a plurality of power consumption settings can be stored in a look up table structure 85. The table structure 85 can, for example, reside in memory 38. ENTRY1 designates a first power consumption setting entry, ENTRY2 designates a second power consumption setting entry, and so forth. Each power consumption setting entry includes control bits for controlling the power consumption settings used by each of the various local oscillators and signal path circuits of the transceiver of FIG. 3. There are multiple power consumption setting entries for each possible transmitter output power, where each of these entries is for a condition of a different amount of receive band noise being estimated to be present on the receiver input. In the diagram, each column of entries corresponds to a different transmitter output power setting. In the vertical dimension, the entries are ordered as illustrated in order of increasing power consumption. In a condition of poor receive band noise (for example, as estimated by application of method 400 of FIG. 17), the processor can dial down the up converter gain and increase driver amplifier gain. This usually saves current and reduces power consumption. For the appropriate column, the power setting is found by moving up in the column of entries. This equates to supplying table 85 with a smaller address that results in an entry higher up in the table being output from the table and being used. In a condition of good receive band noise (for example, as estimated by application of method 400 of FIG. 17), the processor can dial up the up converter gain and decrease driver amplifier gain. This usually increases current and increases power consumption. This equates to supplying table 85 with a larger address that results in an entry lower down in the table being output from the table and being used. The least significant bit of the lookup address may, for example, be the result of a determination as to whether the temperature of the transceiver is above or below a hysteresis adjusted threshold temperature as described above in connection with FIG. 18. The entry that is output of table 85 is written via serial bus 31 into the control registers 75 and 76.

In one example, structure 85 is an amount of memory located on the RF transceiver integrated circuit 3, and this memory stores a plurality of power consumption settings. The settings are stored in an addressable order of increasing power consumption. The one setting that is output by the memory at a given time depends on, and changes according to, operating conditions of the RF transceiver integrated circuit and/or inputs received from the digital baseband processor integrated circuit 4. For example, rather than settings being output from registers 75 and 76 that only store one setting, the portions of registers 75 and 76 that store settings are made to be memories so that multiple settings can be stored.

Figure 20:
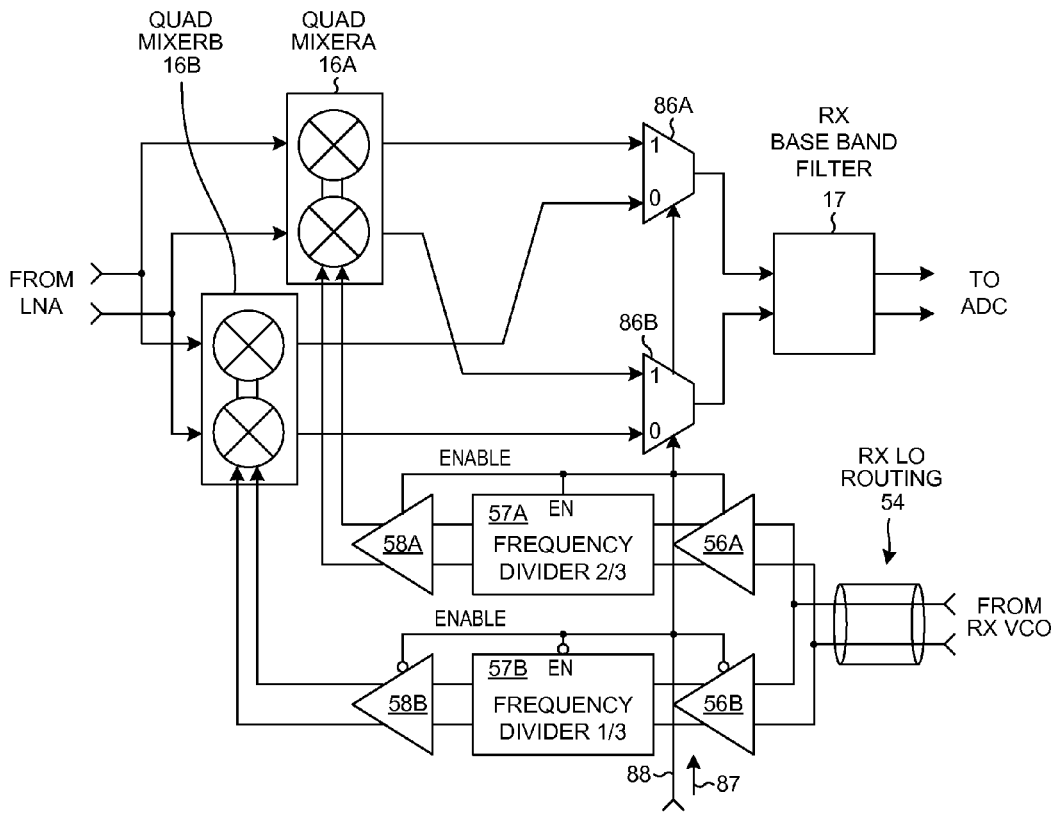
FIG. 20 is a circuit diagram of an embodiment where a power consumption setting involves selecting which one of two sets of input buffer/frequency divider/output buffer/mixer circuitry will be used.

FIG. 20 is a diagram of one possible implementation of mixer 16 in the receive signal path and of the frequency divider 57 in the RX LO signal path to mixer 16. Rather than changing the power setting by adjusting a supply current to a single frequency divider and single quadrature mixer, in the embodiment of FIG. 20 there are two separate sets of input buffer/frequency divider/output buffer/quadrature mixer circuitry. The first set involves input buffer 56A, 2/3 frequency divider 57A, output buffer 58A, and quadrature mixer 16A. The second set involves input buffer 56B, 1/3 frequency divider 57B, output buffer 58B, and quadrature mixer 16B. The 2/3 frequency divider 57A is a larger circuit and consumes more power than the 1/3 frequency divider 57B. If a lower power consumption setting is desired, then the set involving 2/3 frequency divider 57B is enabled and used and the other set is disabled. Using the set involving the 2/3 frequency divider, however, introduces less noise when downconverting than does the set involving the 1/3 frequency divider. If, on the other hand, a higher power consumption setting is desired then the set involving the 1/3 frequency divider 57A is enabled and used and the other set is disabled. The pair of 2:1 analog multiplexers 86A and 86B function to supply the signal output from a selected one of the quadrature mixers 16A and 16B to the RX baseband filter 17. The selection signal 87 on conductor 88 is one of the bits of information output from the control register 76.

The technique of providing two sets of circuitry and selecting one of the two for use depending on a performance requirement is not limited to use in the receiver mixer. In another embodiment, two sets of frequency divider/output buffer/mixer circuitry is provided in the transmitter and one of the bits in control register 75 determines which one of the two sets is enabled and used. One of the sets involves higher power consumption but also outputs a transmit signal having less distortion and noise.

Figure 21:
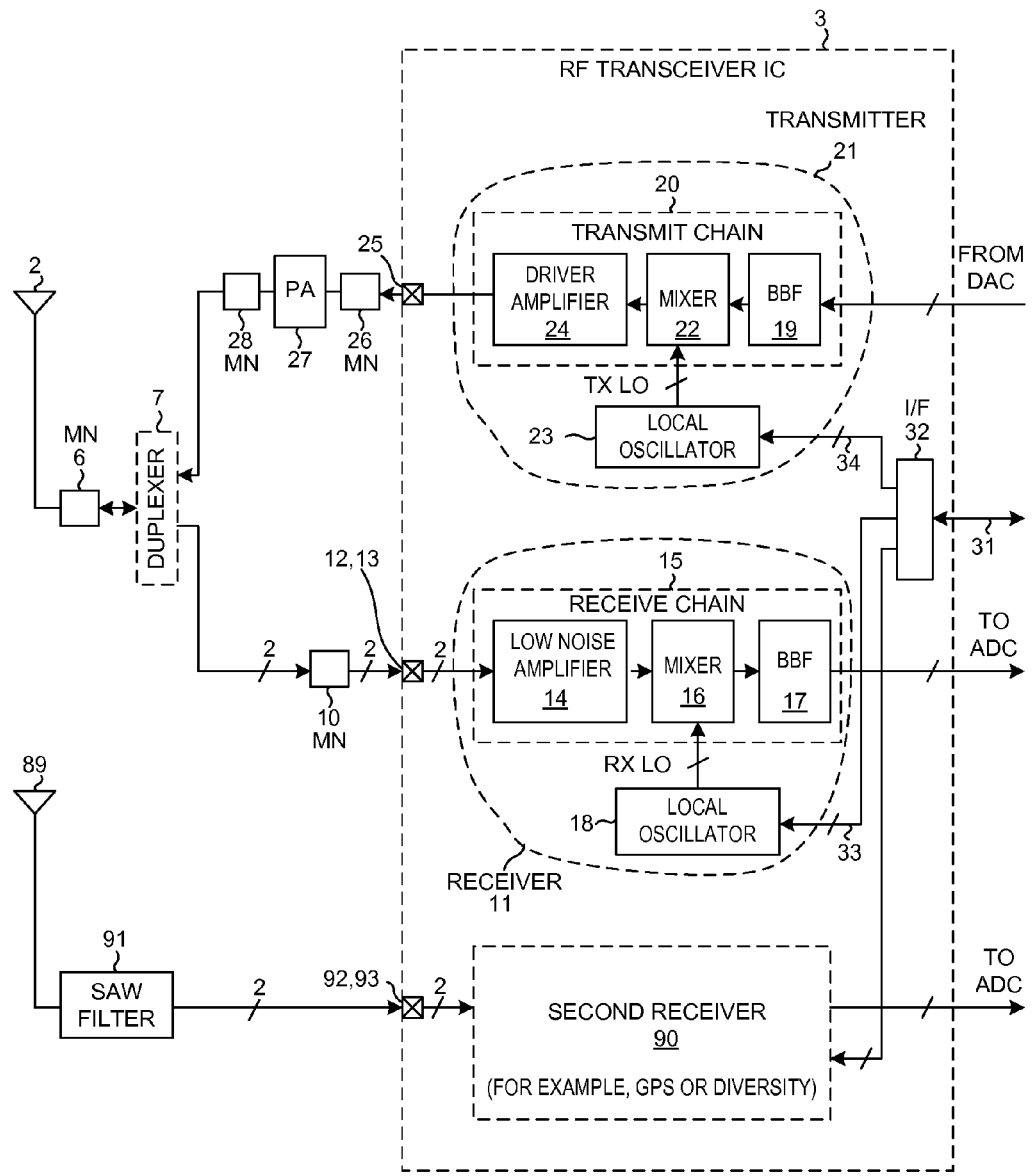
FIG. 21 is a diagram of an embodiment involving a second receiver that receives using its own second antenna, and where the methods 100, 200, 300 and 400 can be carried out using the transmitter and the second receiver.

FIG. 21 is a diagram of an embodiment of the RF transceiver integrated circuit 3 and antenna parts of the cellular telephone of FIG. 1 where the transceiver integrated circuit further includes a second receiver 90. Signals received on a second antenna 89 pass through a SAW filter 91 on their way to the input 92,93 of the second receiver 90. Antenna 2 may be electromagnetically coupled to antenna 89 such that transmit leakage passes from antenna 2, to antenna 89, through SAW filter 91, and to the input 92, 93 of second receiver 90. The second receiver 90 may, for example, be a diversity receiver used to engage in cellular telephone communications in combination with receiver 11. The diversity receiver may be of identical construction to the first receiver 11 and may be interfaced to and controlled by digital baseband integrated circuit 4 in the same way. Alternatively, the second receiver 90 may be another type of receiver, for example, a GPS (Global Positioning System) receiver. The second receiver 90 is illustrated in FIG. 21 to illustrate that the methods described above can be carried out using transmitter 21 and the second receiver 90 rather than using transmitter 21 and the first receiver 11. Rather than determining characteristics of a signal path through a duplexer, the same methods are employed to determine characteristics of a signal path involving antenna to antenna coupling and/or other coupling onto the input of second receiver 90. The receiver involved in the method need not be a receiver that engages in full-duplex communications with the transmitter, but rather may be another type of receiver that experiences unwanted transmitter leakage from the transmitter. The receiver involved in the method can be interfaced to and controlled by the processing mechanism that performs the decision making of the method by any suitable interface or connection. The serial bus connection and ADC bus illustrated in FIG. 21 is but one illustrative way that the second receiver can be interfaced to the processing mechanism.

In one advantageous application, the same transceiver integrated circuit design is employed by multiple different board-level manufacturers of cellular telephones. In some cellular telephone designs there is substantial unwanted coupling between antennas 2 and 89, whereas in other cellular telephone designs there is less unwanted coupling. The methods described above are usable to characterize the transmit leakage path in each cellular telephone as manufactured and, if possible, to set the second receiver of the individual telephone to use a lower power consumption setting in a situation in which the antenna-to-antenna coupling is less problematic. If, on the other hand, the result of the transmitter-to-receiver isolation parameter determination of the manufactured telephone indicates that there is more transmit leakage (for example, due to more antenna-to-antenna coupling), then the method results in the second receiver being set to use the higher power consumption setting so that the telephone will meet performance requirements.

FIG. 22 is a flowchart of a method 600 usable to detect usage of one of the first through fourth methods described above where a cellular telephone was programmed to use a lower transceiver power consumption setting if, as a result of an in-circuit transmit leakage path measurement, it was determined that a transmitter-to-receiver isolation parameter indicated that a higher transceiver power consumption setting was not required to meet performance requirements. Due to variability in the actual leakage path being characterized from cellular telephone to cellular telephone, if a set of cellular telephones of a single model and make are tested then those cellular telephones will be revealed to have been programmed to have different power consumption settings. Accordingly, in a first step (step 601), a set of cellular telephones of a single model and make are obtained. Each of these cellular telephones is then tested (steps 603-605). For each cellular telephone tested, a fixed receiver gain is maintained (the highest receiver gain used by the cellular telephone) and a fixed transmit output power is maintained (the maximum transmit output power used by the cellular telephone), and during the testing the cellular telephone's power consumption is recorded for cellular telephone operation in each of the channels of a band.

In one example, a cellular telephone being tested is put in communication with a testing device that emulates a basestation. The testing device can supply signals onto the antenna of the cellular telephone being tested. Per the cellular telephone standard being used, the cellular telephone must be able to receive a receive signal at the antenna is at a minimum signal strength. When the receive signal on its antenna as at this minimum signal strength as specified by the standard, the cellular telephone will set its receiver at its maximum receiver gain setting. To ensure that the cellular telephone is in this maximum receiver gain setting in accordance with method 600 of FIG. 22, receive signals are supplied to the cellular telephone starting at a low signal strength and increasing in power until the minimum signal strength is reached. At some point in the sequence the cellular telephone begins to successfully receive the signal. As the signal strength of signals supplied to the cellular telephone increases up to the minimum signal strength, the power consumption of the cellular telephone is monitored and is detected to remain substantially constant. As long as the receiver gain state remains at the maximum receiver gain setting and the transmitter remains set at a constant output power setting, the power consumption will remain fairly constant. When the minimum signal strength signal is successfully received by the cellular telephone and the cellular telephone power consumption has remained constant, it is confirmed that the receiver of the cellular telephone is operating using its highest receiver gain.

Transceiver power consumption can, for example, be determined by measuring overall transceiver current consumption and supply voltage on its battery connections. Alternatively, transceiver power consumption can be determined by measuring current supplied as a voltage onto a terminal of the transceiver integrated circuit. In some cases, current is measured flowing into an LNA power input terminal on the integrated circuit package of the transceiver and the LNA input power is used as a measure of the overall transceiver current consumption.

When the cellular telephone is operating with its receiver at its highest receiver gain, then the cellular telephone will also typically set its transmitter to output at its maximum transmit power as allowed by the standard. As the signal strength of the signal supplied to the cellular telephone is increased in the sequence described above, the output power of the transmitter is monitored by the testing equipment to confirm that it remains fixed. If it remains fixed then it is concluded that the cellular telephone is transmitting using its maximum output power setting. The maximum output power setting should result in a transmit output power that is very close to the maximum transmit output power (on the cellular telephone antenna) allowed under the cellular telephone standard being used.

When the current consumption of the cellular telephone is recorded (under the conditions described above of minimum receiver gain and maximum transmitter output power) for each channel, and the resulting data is analyzed, the cellular telephones will be recognized to fall into different categories, where each category is characterized by the cellular telephones in that same category exhibiting a common pattern of power consumption versus channel (step 606). If categories of the cellular telephones are revealed due to the cellular telephones exhibiting different transceiver power consumption versus channel patterns (step 606), then use of one of the first through fourth methods has been detected (step 607), otherwise use of the method has not been detected (step 608).

FIG. 23 is a diagram that illustrates a result of the categorization step 606 of the method of FIG. 22. The number of the channel 97 is shown increasing from left to right. In the particular illustrated example, the cellular telephones of the set as tested fall into three categories. The first category is characterized by the cellular telephones of that category exhibiting power consumption versus channel PATTERN#1 94. The second category is characterized by the cellular telephones of that category exhibiting power consumption versus channel PATTERN#2 95. The third category is characterized by the cellular telephones of that category exhibiting power consumption versus channel PATTERN#3 96. The set of cellular telephones tested may involve duplexers in a circuit such as duplexer 7 of the circuit of FIG. 2. In such a case, in one last confirmatory and optional step (not shown), the duplexers of all the cellular telephones of the set are removed from their respective cellular telephones and are tested. If duplexer performance as tested falls into categories, where transmit band rejection and/or receive band rejection of the duplexers of each category correlate to the measured transceiver power consumption versus channel pattern of a corresponding one of the categories of cellular telephones (as determined in step 606 of the method of FIG. 22), then it is confirmed that the individual cellular telephones have been programmed differently, on a one by one basis, to take advantage of different in-circuit duplexer performance.

In one novel aspect, a set of cellular telephones has the same hardware design. The cellular telephones of the set fall into a plurality of categories as determined by the transceiver power consumption versus channel patterns. Cellular telephones of the first category exhibit a first transceiver power consumption versus channel pattern; cellular telephones of the second category exhibit a second transceiver power consumption versus channel pattern; and so on. In addition, the duplexers of the cellular telephones also fall into categories as determined by the transmit band rejection and/or receive band rejection versus channel pattern of the duplexers. Duplexers of the first category exhibit a first transmit band rejection and/or receive band rejection versus channel pattern; duplexers of the second category exhibit a second transmit band rejection and/or receive band rejection versus channel pattern; and so on. There is a correlation between the category of duplexer performance and the corresponding category of cellular telephone based on power consumption versus channel patterns. Namely, all cellular telephones in the same category of power consumption versus channel pattern have duplexers in the same category of duplexer performance.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. In one specific example, memory 38 of FIG. 1 is a processor-readable medium that stores a set of processor-readable instructions 36. Processor 35 reads and executes the processor-readable instructions, thereby causing the method 100 of FIG. 9 to be carried out.

Although certain specific embodiments are described above for instructional purposes, the teachings of this patent document have general applicability and are not limited to the specific embodiments described above. In each of the methods 100, 200, 300 and 400, the steps before the determining of the transmitter-to-receiver isolation parameter step can be done in any possible order so long as the input values necessary for determining the transmitter-to-receiver isolation parameter are determined before the transmitter-to-receiver isolation parameter step. Although specific embodiments of the methods described above involve characterizing and measuring a signal path from an output of a transmitter to an input of a receiver where the transmitter and receivers are both used to communicate using the same protocol or standard, the methods are of general applicability and may involve characterizing and measuring leakage paths between transmitters that communicate using one protocol and receivers that communicate using another protocol. The leakage path characterized and measured need not involve a duplexer or any particular type of electronic components. Accordingly, various modifications, adaptations, and combinations of the various features of the described specific embodiments can be practiced without departing from the scope of the claims that are set forth below.

What is claimed is:

1. A method comprising:
(a) tuning a transmitter in a device to a receive band of a receiver coupled by a duplexer to the transmitter to output a signal in the receive band of the device;
(b) tuning the receiver in the device to receive in the receive band;
(c) using the receiver to determine a receive band attenuation of a signal path from an output of the transmitter to an input of the receiver; and
(d) if the determined receive band attenuation is above a predetermined amount then using a lower power consumption setting for the transmitter, otherwise using a higher power consumption setting for the transmitter.

2. The method of claim 1, wherein (c) involves:
using a power detector to determine an amount of power;
obtaining a receive power reading and using a receiver gain value and the receive power reading to determine a receive power at the input of the receiver; and
determining the receive band attenuation by subtracting the determined receive power at the input of the receiver from the determined amount of power determined using the power detector.

3. The method of claim 2, wherein the amount of power determined using the power detector is an amount of power supplied to an input of a duplexer.

4. The method of claim 2, wherein the amount of power determined using the power detector is an amount of power output from a duplexer.

5. The method of claim 1, further comprising:
(e) using the transmitter and the receiver to engage in a W-CDMA communication.

6. The method of claim 1, wherein the transmitter and the receiver are parts of a full-duplex transceiver integrated circuit.

7. The method of claim 1, wherein energy of the signal output by the transmitter in the receive band passes through a duplexer and is received by the receiver in the receive band, and wherein the signal path of which the receive band attenuation is determined in (c) passes through the duplexer.

8. The method of claim 1, wherein (b) occurs before (a).

9. The method of claim 1, wherein the lower power setting involves supplying a portion of the receiver with a lower supply current whereas the higher power setting involves supplying the portion of the receiver with a higher supply current.

10. The method of claim 1, wherein the lower power setting involves supplying a portion of the receiver with a lower supply voltage whereas the higher power setting involves supplying the portion of the receiver with a higher supply voltage.

11. An apparatus comprising:
a transmitter tuned to a receive band and configured to output a signal in the receive band of the apparatus;
a receiver configured to receive the signal in the receive band of the receiver coupled by a duplexer to the transmitter and to generate a receive power reading indicative of a power of the signal as received on an input of the receiver;
a power detector configured to output information indicative of a power of the signal at a point along a signal path, wherein the signal path extends from an output of the transmitter, through a duplexer, to the input of the receiver; and a processor configured to determine a receive band attenuation of the signal passing through the signal path based at least in part on the receive power reading and on the information indicative of the power of the signal, wherein if the determined receive band attenuation is above a predetermined amount then the processor causes the transmitter to be set to use a lower power consumption setting whereas if the determined receive band attenuation is below the predetermined amount then the processor causes the transmitter to be set to use a higher power consumption setting.

12. The apparatus of claim 11, wherein the transmitter, the receiver, and the power detector are parts of a W-CDMA full-duplex transceiver integrated circuit.

13. The apparatus of claim 11, wherein the receive band is a band used by the apparatus to engage in a full-duplex communication.

14. An apparatus comprising:
a transmitter tuned to a receive band;
a receiver; and
means for determining a receive band attenuation of a signal output by the transmitter in the receive band of the receiver coupled by a duplexer to the transmitter in the apparatus and received on an input of the receiver, wherein the means is for determining the receive band attenuation based at least in part on a receive power reading indicative of a power of the signal as received on the input of the receiver, wherein if the determined receive band attenuation is above a predetermined amount then the means causes the transmitter to be set to use a lower power consumption setting whereas if the determined receive band attenuation is below the predetermined amount then the means causes the transmitter to be set to use a higher power consumption setting.

15. The apparatus of claim 14, further comprising:
a power detector that outputs information indicative of a power of the signal at a point along a signal path, wherein the signal path extends from an output of the transmitter, through a duplexer, to the input of the receiver, and wherein the means includes a processor that executes a set of processor-executable instructions, wherein the processor is coupled to the power detector so that the processor obtains from the power detector the information indicative of the power of the signal.

16. The apparatus of claim 14, wherein the means is also for controlling the transmitter and the receiver such that the transmitter and receiver engage in a W-CDMA full-duplex communication, wherein the receiver receives signals in the receive band during the W-CDMA full-duplex communication.

17. A non-transitory processor-readable medium storing a set of processor-executable instructions, wherein execution of the set of processor-executable instructions by a processor is for:
causing a transmitter of a device tuned to a receive band of a receiver coupled by a duplexer to the transmitter to output a signal in the receive band of the device;
causing the receiver of the device to receive the signal in the receive band and to generate a receive power reading indicative of a power of the signal as received on an input of the receiver;
receiving information from a power detector, wherein the information is indicative of a power of the signal at a point along a signal path, wherein the signal path extends from an output of the transmitter, through a duplexer, to the input of the receiver; and
determining a receive band attenuation of the signal passing through the signal path based at least in part on the receive power reading and on the information indicative of the power of the signal, wherein if the determined receive band attenuation is above a predetermined amount then the transmitter is set to use a lower power consumption setting whereas if the determined receive band attenuation is below the predetermined amount then the transmitter is set to use a higher power consumption setting.

18. A method comprising:
(a) using a power detector in a device to determine an amount of power output by a transmitter in the device in a transmit band of the device;
(b) using a receiver in the device to determine a receive band attenuation of a signal path from an output of the transmitter to an input of the receiver; and
(c) determining an estimate of a receive band noise power based at least in part on the power determined in (a) and the receive band attenuation determined in (b); and
(d) if the determined receive band noise power is below a predetermined amount then using a lower power consumption setting for the transmitter, otherwise using a higher power consumption setting for the transmitter.

19. The method of claim 18, wherein the transmitter, the receiver, and the power detector are parts of an integrated circuit, wherein (a) involves coupling the output of the transmitter through the integrated circuit to the power detector such that the power detector outputs a value indicative of the amount of power output by the transmitter in the transmit band in (a).

20. The method of claim 19, wherein (b) involves coupling the output of the transmitter through the integrated circuit to the power detector such that the power detector outputs a value indicative of an amount of receive band power being output by the transmitter.

21. The method of claim 18, wherein (a) involves controlling an analog multiplexer such that the analog multiplexer couples the output of the transmitter through the analog multiplexer and to the power detector.

22. The method of claim 18, wherein the determining of the receive band noise power in (c) is based at least in part on: 1) information on a relationship between transmit power in the transmit band at the output of the transmitter and a corresponding amount of receive band noise the transmitter will likely output onto the output of the transmitter, 2) the determined amount of power output in (a), and 3) the receive band attenuation determined in (b).

23. The method of claim 18, wherein the transmitter in (a) is set such that a mobile communication device of which the transmitter is a part transmits in the transmit band from an antenna at a maximum permissible transmit output power, and wherein the estimate of the receive band noise power is an estimate of power in the receive band received on the input of the receiver when the transmitter is set as in (a) such that the mobile communication device of which the transmitter is a part will be transmitting in the transmit band from the antenna at the maximum permissible transmit output power.

24. The method of claim 18, wherein (b) involves using the power detector to determine an amount of power the transmitter outputs in the receive band.

25. The method of claim 18, further comprising:
(e) using the power detector to detect an amount of power on an antenna.

26. The method of claim 18, wherein (b) occurs before (a).

27. An apparatus comprising:
a transmitter;

a power detector in the apparatus configured to output information indicative of a power of a signal being output by the transmitter onto an output of the transmitter;

a receiver; and a processor configured to determine an estimated receive band noise power based at least in part on the information output from the power detector, wherein the estimated receive band noise power is an amount of noise power in a receive band of the apparatus that would be present on an input of the receiver if the transmitter were outputting a signal onto the output of the transmitter that would result in a transmit power on an antenna being at a maximum permissible amount, wherein if the estimated receive band noise power is below a predetermined amount then the processor causes the transmitter to be set to use a lower power consumption setting whereas if the estimated receive band noise power is above the predetermined amount then the processor causes the transmitter to be set to use a higher power consumption setting.

28. The apparatus of claim 27, further comprising:

an analog multiplexer, wherein the transmitter, the receiver, the power detector and the analog multiplexer are all parts of an integrated circuit, and wherein the analog multiplexer is controllable to establish a signal path on the integrated circuit from the output of the transmitter to an input of the power detector.

29. The apparatus of claim 28, further comprising:

a terminal of the integrated circuit, wherein the analog multiplexer is controllable to establish a signal path on the integrated circuit from the terminal to the input of the power detector.

30. An apparatus comprising:

a transmitter;

a power detector in the apparatus configured to output information indicative of a power of a signal being output by the transmitter onto an output of the transmitter;

a receiver; and means for determining an estimated receive band noise power based at least in part on the information output from the power detector, wherein the estimated receive band noise power is an amount of noise power in a receive band of the apparatus that would be present on an input of the receiver if the transmitter were outputting a signal onto the output of the transmitter that would result in a transmit power on an antenna being at a maximum permissible amount, wherein the means is also for causing the transmitter to be set with the lower power consumption setting if the estimated receive band noise power is below the predetermined amount, and for causing the transmitter to be set with the higher power consumption setting if the estimated receive band noise is above the predetermined amount.

31. A non-transitory processor-readable medium storing a set of processor-executable instructions, wherein execution of the set of processor-executable instructions by a processor is for:

causing a transmitter in a device to output a signal from an output of the transmitter;

causing a receiver in the device to receive a portion of the signal onto an input of the receiver;

determining an estimated receive band noise power based at least in part on information output from a power detector in the device, wherein the information is indicative of a power of the signal output from the transmitter, wherein the estimated receive band noise power is an amount of noise power in a receive band of the device that would be present on the input of the receiver if the transmitter were outputting a signal in the transmit band onto the output of the transmitter that would result in a transmit power on an antenna being at a maximum permissible amount; and causing the transmitter to be set with the lower power consumption setting if the estimated receive band noise power is below the predetermined amount, and for causing the transmitter to be set with the higher power consumption setting if the estimated receive band noise is above the predetermined amount.

* * * * *